United States Patent
Lu et al.

(10) Patent No.: US 12,300,351 B2
(45) Date of Patent: May 13, 2025

(54) DIE DISABLEMENT

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 17/823,458

(22) Filed: Aug. 30, 2022

(65) Prior Publication Data

US 2024/0071437 A1   Feb. 29, 2024

(51) Int. Cl.
  *G11C 7/10*   (2006.01)
  *G11C 7/20*   (2006.01)

(52) U.S. Cl.
  CPC ........... *G11C 7/109* (2013.01); *G11C 7/1093* (2013.01); *G11C 7/20* (2013.01)

(58) Field of Classification Search
  CPC .......... G11C 7/109; G11C 7/1093; G11C 7/20
  See application file for complete search history.

(56) References Cited

U.S. PATENT DOCUMENTS

| | | | | |
|---|---|---|---|---|
| 5,619,462 A * | 4/1997 | McClure | ................ | G11C 29/50 365/201 |
| 5,812,861 A * | 9/1998 | Ishac | ................ | G06F 1/30 714/22 |
| 5,946,257 A * | 8/1999 | Keeth | ................ | G11C 5/14 365/201 |
| 7,477,545 B2 * | 1/2009 | Tu | ................ | G11C 29/88 365/185.05 |
| 7,609,561 B2 * | 10/2009 | Cornwell | ................ | G11C 29/883 365/195 |
| 7,715,255 B2 * | 5/2010 | Tu | ................ | H10B 69/00 365/185.04 |
| 8,055,959 B2 * | 11/2011 | Cornwell | ................ | G11C 29/88 365/201 |
| 8,446,772 B2 * | 5/2013 | Tu | ................ | G11C 29/832 365/185.24 |
| 9,875,808 B2 * | 1/2018 | Li | ................ | H01L 25/0657 |
| 11,017,822 B1 * | 5/2021 | Rkc Saraswatula | ... | G11C 5/148 |

(Continued)

OTHER PUBLICATIONS

"Non-Final Office Action", U.S. Appl. No. 17/930,044, filed Dec. 19, 2024, 18 pages.

*Primary Examiner* — Son L Mai
(74) *Attorney, Agent, or Firm* — Colby Nipper PLLC

(57) ABSTRACT

Described apparatuses and methods relate to selectively disabling a die that may be included in a multiple-die package without necessarily disabling all the remaining dies within the package. A nonvolatile circuit, such as one or more fuses, may be included within individual dies and/or otherwise incorporated within the package. The nonvolatile circuit maintains a value for the die that is indicative of the operability of the die. Die disablement logic is operatively coupled to the nonvolatile circuit and can disable the die based on the value indicating that the die is unusable. The disabling of the die by the die disablement logic may be controlled by an override signal that allows the disabling or prevents the logic from disabling the die. Thus, the die disablement logic can prevent a defective die from functioning, but the die disablement logic may be overridden for testing or debugging.

45 Claims, 25 Drawing Sheets

(56) References Cited

U.S. PATENT DOCUMENTS

| | | |
|---|---|---|
| 2011/0302366 A1 | 12/2011 | Peterson et al. |
| 2016/0276016 A1 | 9/2016 | Benedict |
| 2019/0087292 A1 | 3/2019 | Kim et al. |
| 2021/0311638 A1* | 10/2021 | Smith .................... G06F 3/0614 |
| 2022/0100247 A1* | 3/2022 | Garg ..................... G06F 1/3203 |
| 2024/0078041 A1 | 3/2024 | Lu et al. |

* cited by examiner

DIE DISABLEMENT

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and nonvolatile memory (e.g., flash memory). Like the number of cores or speed of a processor, a rate at which data can be accessed, as well as the delays in accessing the data, can impact the performance of an electronic device. This performance impact increases as processors are developed that execute code faster and as applications operate on increasingly larger data sets that require ever-larger memories.

BRIEF DESCRIPTION OF THE DRAWINGS

This document describes apparatuses and techniques for implementing die disablement with reference to the following drawings. The same numbers are used throughout the drawings to reference like features and components:

FIG. 2-1 illustrates an example computing system that can implement one or more aspects of die disablement;

FIG. 2-2 illustrates an example of a system that includes a host device and a memory device coupled together via an interconnect in which die disablement may be implemented with the memory device;

FIGS. 3-1 through 3-3 illustrate examples of alternative implementations of die disablement;

FIGS. 4-1 and 4-2 illustrate an example of a die being disabled by die disablement logic as a result of a value maintained for the die in a nonvolatile circuit;

FIGS. 5-1 and 5-2 illustrate an example of a die not being disabled by die disablement logic despite a value maintained in a nonvolatile circuit as a result of a signal being received to override the die disablement logic and/or the maintained value;

FIGS. 6-1 through 6-4 illustrate examples of a die being disabled or not being disabled by die disablement logic depending on whether a signal to override the die disablement logic is received within an established delay interval;

FIGS. 7-1 through 7-5 illustrate examples of a die being disabled or not being disabled depending on when a signal to override the die disablement logic is received relative to a selectable delay interval;

FIGS. 8-1 and 8-2 illustrate examples of die disablement logic circuitry that is usable to disable a die based on stored values and/or signals and disable one or more circuit blocks within the die;

FIGS. 9-1 and 9-2 are example signal timing diagrams to illustrate how a die disablement circuit can respond to values and/or signals following receipt of a reset signal.

DETAILED DESCRIPTION

Overview

Figure 1:
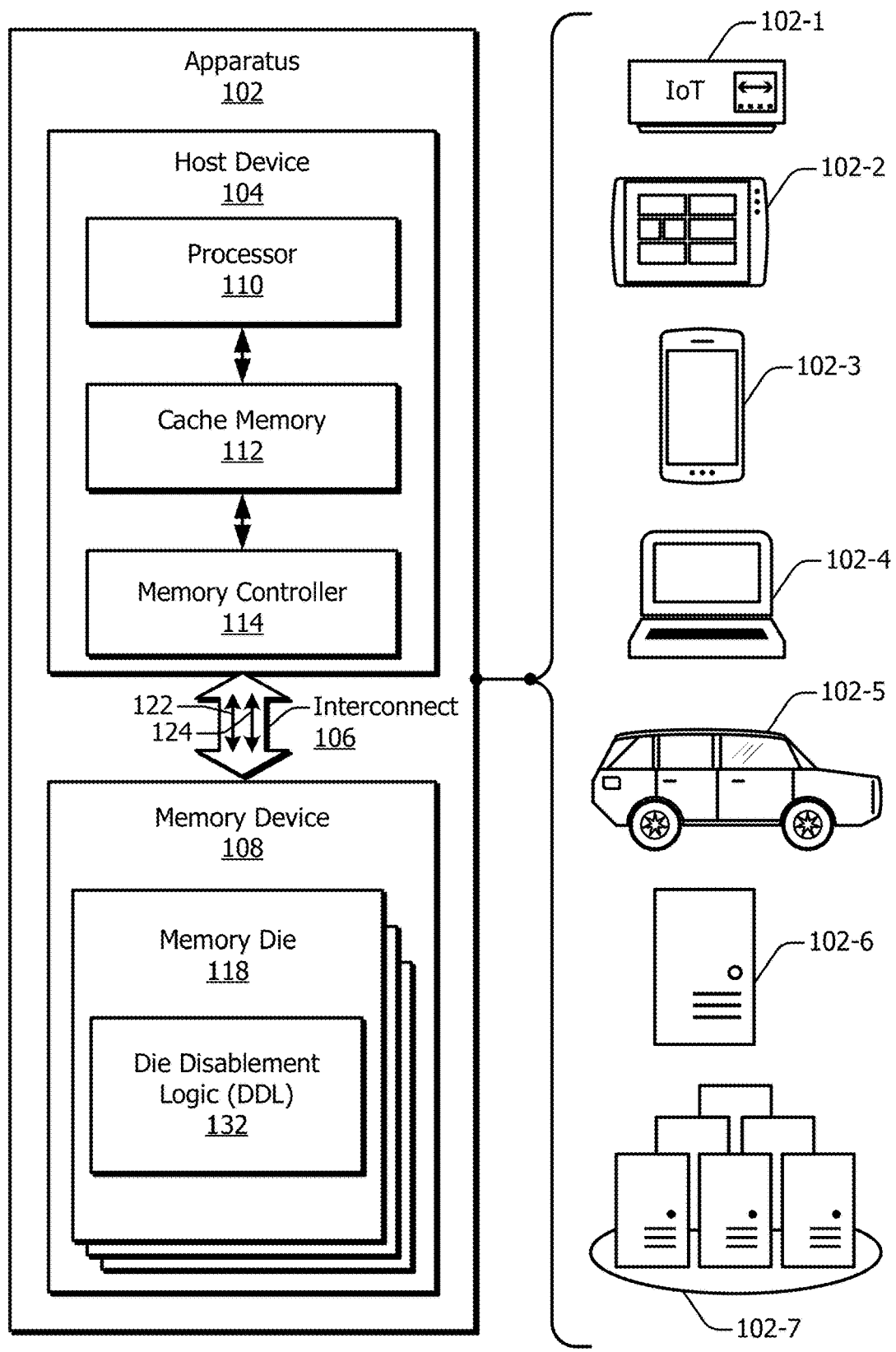
FIG. 1 illustrates an example operating environment including apparatuses that can implement die disablement.

The increasing capabilities of electronic devices continue to require larger, higher-density memory to maintain large sets of data used in complex operations. As the storage capability of memory devices increases, electronic devices can provide enhanced features, such as high-resolution graphics and artificial intelligence. In order to produce higher-density memory devices, it may be desirable to form a memory product that can include multiple memory dies and their interconnections in a single package. This may be contrasted with packaging individual memory dies separately, which packages are then separately mounted on a circuit board to form a memory module or similar. Compute Express Link™ (CXL™) dynamic random-access memory (DRAM) devices, for example, may include multiple packages. Each package may be realized using multiple dies, which may be interconnected. The multiple dies are combined in a single module to form a compact, high-density memory device that may offer lower latency.

Creating each of the integrated circuits for each die may involve the formation of mind-boggling numbers of infinitesimal transistors, capacitors, and other components, as well as the myriad interconnections therebetween, on a carefully prepared crystalline substrate. When multiple, independent dies are placed into multiple, independent packages, and if one of the dies fails testing—potentially because a single infinitesimal component within a die is flawed—other dies formed on the substrate may be used while only the failing die is discarded because each of the dies is packaged separately from one another. Although it is undesirable to discard any dies, at least the other fabricated dies are still usable.

On the other hand, in a multiple-die package, if one die is defective, the utility of the entire package may be ruined. For example, when a package includes a memory with multiple memory dies, if one of the memory dies is faulty, the memory cannot be trusted to store data accurately and reliably for later retrieval. Thus, a package with even a single defective die may have to be discarded.

If every die incorporated in a package must be fully operational for the package to be useful, it reduces the pool of packages available for producing high-density memory devices, such as a CXL memory device (e.g., at least one DRAM device). Further, the cost of discarding packages effectively increases the cost to produce devices that are realized using multiple-die packages.

To address these concerns at least partially, the disclosed apparatuses and techniques provide a way to disable one or more unusable dies while allowing the other dies of a package to be used. If one or more disabled dies include memory, the overall memory capacity of the package may be reduced. With the unusable die(s) disabled, however, the remainder of the package is still usable (and the package may be saleable) even if at a reduced memory capacity. Being able to use the package, even at a reduced capacity or capability, provides an economic benefit as compared to the package being a total loss.

According to some disclosed implementations, a value may be stored in a fuse circuit or other non-volatile circuit to indicate that a die incorporated in a package is faulty or is otherwise unusable. Upon power-up or after a reset signal is received, die disablement logic (e.g., die kill logic) associated with the die reads the value and can cause the die to be disabled based on the value. The die may be disabled by, for example, disconnecting the die from power and/or by disabling input and/or output pins of the die. As a result, the die will not generate output, which may be corrupt due to the die being faulty, responsive to input signals. If at least a portion of the die is disconnected from power, the faulty die may also consume less power. At the same time, while the unusable die is disabled, the remaining dies on the package can still be used.

In various implementations, the die disablement logic can enable a tester, an engineer, or other operator to override the stored value to prevent the die disablement logic from disabling the die. The override, which can be enacted via an override signal, thus enables the tester or engineer to keep the die active for testing, debugging, or other purposes. The ability to override the die disablement logic may be restricted to a default delay interval that provides a fixed interval during which the die disablement logic may be overridden. Alternatively or additionally, the die disablement logic may provide for a selectable delay interval. In such an implementation, an engineer or tester may be able to specify or choose the delay interval during which the die disablement logic may be overridden. In various implementations, for example, the die disablement logic may allow a choice between a default interval and a selected interval that is either longer or shorter than the default interval. Regardless, the delay interval can restrict when an override signal may be presented to control whether the die disablement logic is allowed to disable the die or prevented from disabling the die.

Example Operating Environments

Described apparatuses and methods relate to selectively disabling a die that may be included in, e.g., a multiple-die package without disabling all the remaining dies within the package. A nonvolatile circuit may be included within individual dies and/or otherwise incorporated within the package. The nonvolatile circuit maintains a value for a die that is indicative of the operability of the die. Logic is operatively coupled to the nonvolatile circuit and is configured to disable the die based on the value indicating that the die is inoperable. The disabling of the die by the die disablement logic may be controlled by an, e.g., external override signal that enables or disables the die disablement logic to allow or prevent, respectively, the die disablement logic from disabling the die. Application of the signal to enable or disable the die disablement logic may be restricted to a delay interval that follows a powering on or a reset of the memory device. Thus, the die disablement logic is configured to prevent an inoperable die from functioning, but the die disablement logic may be disabled for testing or debugging of the memory device.

FIG. 1 illustrates an example operating environment including an apparatus 102 that can implement die disablement. The apparatus 102 can include various types of electronic devices, including an internet-of-things (IoT) device 102-1, a tablet device 102-2, a smartphone 102-3, a notebook computer 102-4, a passenger vehicle 102-5, a server computer 102-6, and a server cluster 102-7 that may be part of cloud computing infrastructure, a data center, or a portion thereof (e.g., a printed circuit board (PCB) or blade server). Other examples of the apparatus 102 include a wearable device (e.g., a smartwatch or intelligent glasses), an entertainment device (e.g., a set-top box, a video dongle, a smart television, a gaming device, etc.), a desktop computer, a motherboard, a server blade, a consumer appliance, a vehicle, a drone, industrial equipment, a security device, a sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, multiple instances of a memory die 118, which may be included as part of a package. The at least one memory die 118 may include a dynamic random-access memory (DRAM) die or one or more other volatile or nonvolatile memory dies. For example, when the one or more memory dies 118 include DRAM dies, the memory device 108 may include a three-dimensional (3D) stacked DRAM device, which may be a high-bandwidth memory (HIBM) device or a hybrid memory cube (HMC) device. The memory device 108 can operate as a main memory for the apparatus 102. The memory device 108 may also or instead include storage memory. In such cases, the memory device 108 may include a flash memory, solid-state drive, phase-change memory (PCM), 3D XPoint™ memory, or another type of storage memory.

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a DDR memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

In some implementations, the interconnect 106 can include at least one command and address bus 122 (CA bus 122) and at least one data bus 124 (DQ bus 124). Each bus may be a unidirectional or a bidirectional bus. The CA bus 122 and the DQ bus 124 may couple to CA and DQ pins, respectively, of the memory device 108. The interconnect 106 may also include at least one chip-select (CS) I/O or line (not illustrated in FIG. 1) that can, for example, couple to one or more CS pins of the memory device 108. The interconnect 106 may further include at least one clock bus (CK bus—not illustrated in FIG. 1) that is part of or separate from the CA bus 122.

In other implementations, the interconnect 106 can be realized as a CXL link. In other words, the interconnect 106 can comport with at least one CXL standard or protocol. The CXL link can provide an interface on top of the physical layer and electricals of, e.g., a PCIe 5.0 physical layer. The CXL link can cause requests to and responses from the memory device 108 to be packaged as flits. In still other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated together on an IC or fabricated on separate ICs and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 2 an example computing system architecture having at least one host device 104 coupled to a memory device 108.

Two or more memory components (e.g., modules, dies, banks, or bank groups) can share the electrical paths or couplings of the interconnect 106. In some implementations, the CA bus 122 transmits addresses and commands from the memory controller 114 of the host device 104 to the memory device 108, which CA bus 122 may exclude propagation of data. The DQ bus 124 can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, and as discussed in greater detail with respect to FIG. 2, die disablement logic 132 (DDL 132) can also be incorporated into the memory device 108 at any functional position between the interconnect 106 and the memory die 118.

As illustrated in FIG. 1, the memory device 108 may include at least one instance of die disablement logic 132, which can at least partially implement die disablement as described herein. In example implementations, the die disablement logic 132 is configured to identify a value for a die and, based on the value associated with the die, disable the die. The value may be maintained in a fuse circuit or other nonvolatile circuit. The nonvolatile circuit can be realized with a nonvolatile memory cell, such as a flash memory cell, or a hard-wired circuit, such as a laser-severable linkage or a voltage-programmable circuit. The value maintained in the fuse circuit for a die may represent, for example, whether one or more of each memory die 118 of the memory dies has been determined to have passed testing and be usable or failed testing and be unusable.

If the value for one or more of the memory dies 118 indicates that an associated die is unusable, the die disablement logic 132 may disable the associated die, as further described below with reference to FIGS. 3-1 through 7-5. With the unusable die or dies of the memory dies 118 disabled, the memory device 108 may operate (albeit at a reduced capacity) by using the remaining usable dies of the memory device 108. It will be appreciated that die disablement logic 132 can also or alternatively be used to disable a die other than a memory die (e.g., a controller, a processor, or a radio frequency integrated circuit), although the following description of die disablement and its operation uses the example of memory dies.

Figures 1, 2:
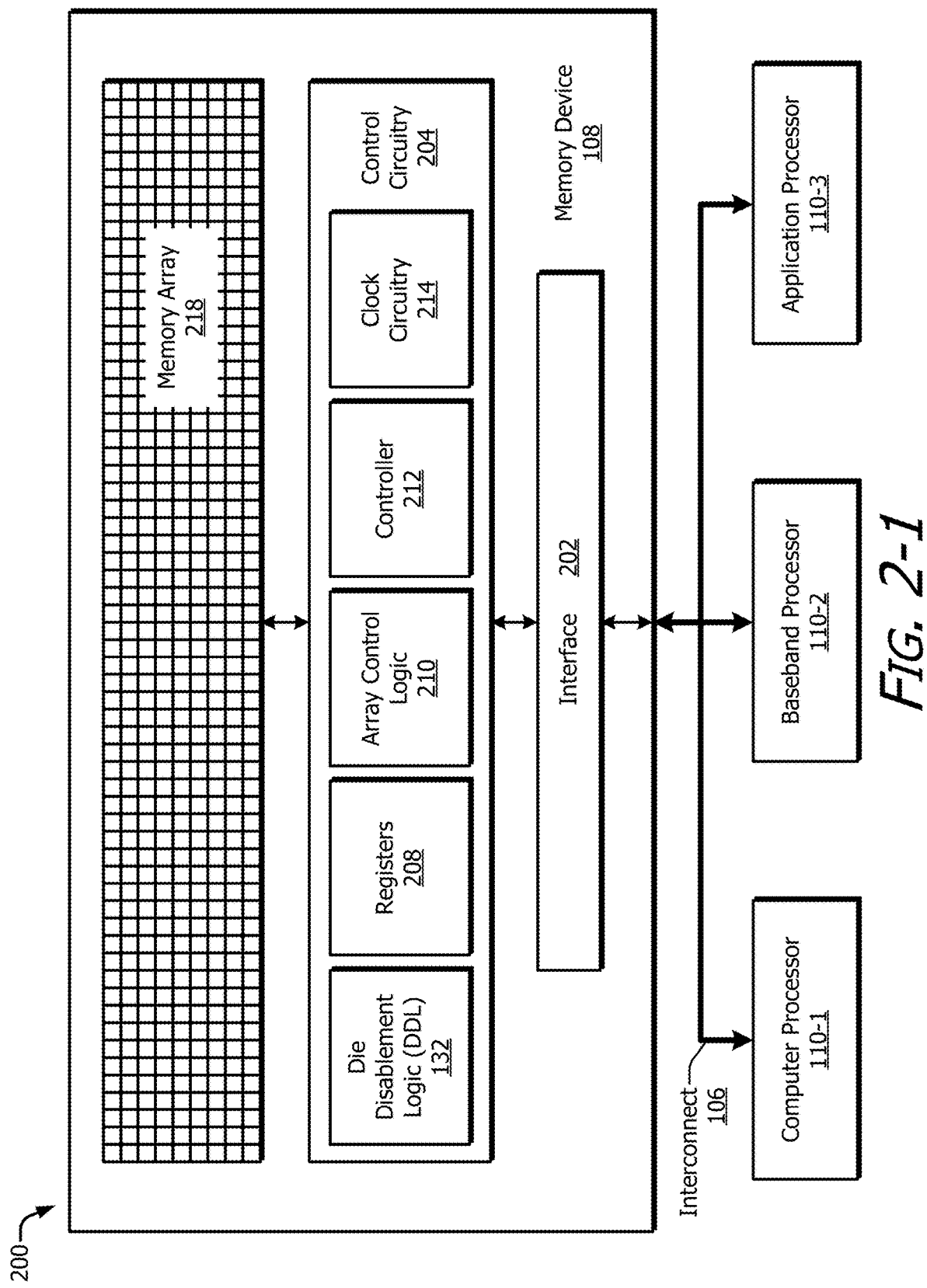
Figure 2:
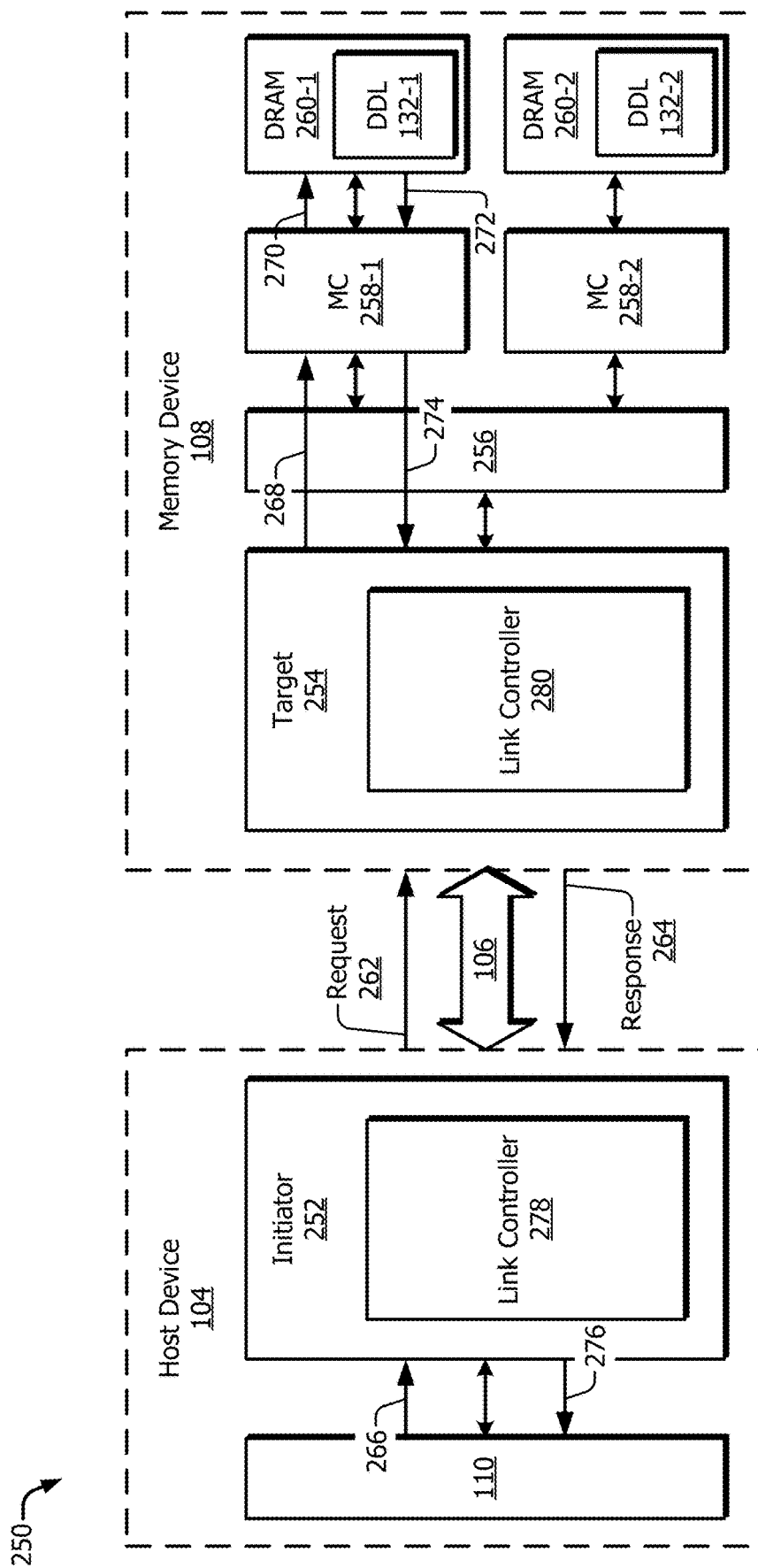

FIG. 2 illustrates an example computing system 200 that can implement aspects of die disablement in a memory device. In some implementations, the computing system 200 includes at least one memory device 108, at least one interconnect 106, and one or more processors 110-1 through 110-3. In this implementation, the die disablement logic 132 is included in the memory device 108. As further described below, the die disablement logic 132 may be implemented within each die of the memory dies (not shown in FIG. 2) in association with a memory array 218, or the die disablement logic 132 may be implemented as a common device configured to selectively disable each of the memory dies. As used herein, a "common" item (e.g., an item that is "common" to two or more components) can be part of the two or more components, configured to operate on or with respect to the two or more components, capable of being used jointly by the two or more components, or otherwise associated with the two or more components.

The memory device 108, in addition to the memory array 218, can include at least one interface 202 and control circuitry 204 operatively coupled to the memory array 218.

The memory device 108 can correspond to one or more of the cache memory, the main memory, or a storage memory of the apparatus 102 of FIG. 1. Thus, the memory array 218 can include an array of memory devices, including but not limited to memory devices of DRAM, SDRAM, 3D-stacked DRAM, DDR memory, low-power DRAM, or LPDDR SDRAM. For example, the memory array 218 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb. The memory array 218 and the control circuitry 204 may be components on a single semiconductor die within a single package or may be one of the components among multiple, interconnected packages.

The control circuitry 204 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 204 can include one or more registers 208, at least one instance of array control logic 210, at least one controller 212, and at least one instance of clock circuitry 214. When the memory array 218 includes DRAM devices, the control circuitry 204 also may include refresh control logic (not shown) to refresh charges representing stored data values, as will be appreciated by one skilled in the art of DRAM devices.

The interface 202 can couple the control circuitry 204 or the memory array 218 directly or indirectly to the interconnect 106. As shown in FIG. 2, the registers 208, the array control logic 210, the controller 212, the clock circuitry 214, and the die disablement logic 132 can be part of a single component (e.g., the control circuitry 204). In other implementations, one or more of the registers 208, the array control logic 210, the controller 212, the clock circuitry 214, or the die disablement logic 132 may be separate components on a single package or distributed across multiple interconnected packages. These components may individually or jointly couple to the interconnect 106 via the interface 202.

The interconnect 106 may use one or more of a variety of interconnects that communicatively couple together various components and enable commands, addresses, data, or other information to be transferred between two or more components (e.g., between the memory device 108 and the processor 110). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 122 and a DQ bus 124 (as illustrated in FIG. 1). As discussed above with respect to FIG. 1, the interconnect 106 can include a CXL link or comport with at least one CXL standard. The CXL link can provide an interface or overlay on top of the physical layer and electricals of the PCIe 5.0 physical layer.

In some aspects, the memory device 108 may be a "separate" component relative to the host device 104 (of FIG. 1) or any of the processors 110. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processors 110-1 through 110-3, by being combined on a PCB or in a single package or an SoC.

The described apparatuses and methods may be appropriate for memory designed for lower-power operations or energy-efficient applications. An example of a memory standard related to low-power applications is the LPDDR standard for SDRAM as promulgated by the Joint Electron Device Engineering Council (JEDEC) Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a standard.

As shown in FIG. 2, the computing system 200 may include a computer processor 110-1, a baseband processor 110-2, and/or an application processor 110-3 that is coupled to the memory device 108 through the interconnect 106. The processors 110-1 through 110-3 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 110-2 may include or be coupled to a modem (not illustrated in FIG. 2) and referred to as a modem processor. The modem or the baseband processor 110-2 may be coupled wirelessly to a network via, for example, cellular, Wi-Fi®, Bluetooth®, near field, or another technology or protocol for wireless communication.

In some implementations, the processors 110-1 through 110-3 may be connected directly to the memory device 108 (e.g., via the interconnect 106). In other implementations, one or more of the processors 110-1 through 110-3 may be indirectly connected to the memory device 108 (e.g., over a network connection or through one or more other devices). Further, any of the processors 110-1 through 110-3 may be realized as one that can communicate over a CXL-compatible interconnect. Accordingly, respective processors 110-1 through 110-3 can include or be associated with respective link controllers. Alternatively, two or more of the processors 110-1 through 110-3 may access the memory device 108 using a shared link controller 278 (of FIG. 2-2). In some of such cases, the memory device 108 may be implemented as a CXL-compatible memory device (e.g., as a CXL Type 3 memory expander), or another memory device 108 that is compatible with a CXL protocol may also or instead be coupled to the interconnect 106.

FIG. 2-2 illustrates an example of a system 250 that includes a host device 104 and a memory device 108 that are coupled together via an interconnect 106. The system 250 may form at least part of an apparatus 102 as shown in FIG. 1. As illustrated, the host device 104 includes a processor 110 and a link controller 278, which can be realized with at least one initiator 252. Thus, the initiator 252 can be coupled to the processor 110 or to the interconnect 106 (including to both), and the initiator 252 can be coupled between the processor 110 and the interconnect 106. Examples of initiators 252 may include a leader, a primary, a master, a main component, and so forth.

In the illustrated example system 250, the memory device 108 includes a link controller 280, which may be realized with at least one target 254. The target 254 can be coupled to the interconnect 106. Thus, the target 254 and the initiator 252 can be coupled to each other via the interconnect 106. Examples of targets 254 may include a follower, a secondary, a slave, a responding component, and so forth. The memory device 108 also includes a memory, which may be realized with at least one memory module or other component, such as a DRAM 260 (e.g., DRAM 260-1 and DRAM 260-2), memory controllers 258 (e.g., MC 258-1 and MC 258-2), as described further below.

In example implementations, the initiator 252 includes the link controller 278, and the target 254 includes the link controller 280. The link controller 278 or the link controller 280 can instigate, coordinate, cause, or otherwise control signaling across a physical or logical link realized by the interconnect 106 in accordance with one or more protocols. The link controller 278 may be coupled to the interconnect 106. The link controller 280 may also be coupled to the interconnect 106. Thus, the link controller 278 can be coupled to the link controller 280 via the interconnect 106. Each link controller 278 or 280 may, for instance, control communications over the interconnect 106 at a link layer or at one or more other layers of a given protocol. Communication signaling may include, for example, a request 262 (e.g., a write request or a read request), a response 264 (e.g., a write response or a read response), and so forth.

The memory device 108 may further include at least one interconnect 256 and at least one memory controller 258 (e.g., MC 258-1 and MC 258-2). Within the memory device 108, and relative to the target 254, the interconnect 256, the memory controller 258, and/or the DRAM 260 (or other memory component) may be referred to as a "backend" component of the memory device 108. In some cases, the interconnect 256 is internal to the memory device 108 and may operate in a manner the same as or different from the interconnect 106.

As shown, the memory device 108 may include multiple memory controllers 258-1 and 258-2 and/or multiple DRAMs 260-1 and 260-2. Although two each are shown, the memory device 108 may include one or more memory controllers and/or one or more DRAMs. For example, a memory device 108 may include four memory controllers and 16 DRAMs, such as four DRAMs per memory controller. The memory components of the memory device 108 are depicted as DRAM only as an example, for one or more of the memory components may be implemented as another type of memory. For instance, the memory components may include nonvolatile memory like flash or PCM. Alternatively, the memory components may include other types of volatile memory like static random-access memory (SRAM). A memory device 108 may also include any combination of memory types.

In some cases, the memory device 108 may include the target 254, the interconnect 256, the at least one memory controller 258, the at least one DRAM 260, or a combination thereof, in a single multiple-die package or multi-die package (MDP), on a single printed circuit board, within a single housing, or within another enclosure. The enclosure, however, may be omitted or may be merged with an enclosure for the host device 104, the system 350, or an apparatus 102 (of FIG. 1). The interconnect 256 can be incorporated within a multiple-die package to interconnect different dies within a package or can be incorporated with a PCB. Generally, each of the target 254, the memory controller 258, and the DRAM 260 may be combined into at least one package or incorporated into separate packages. Regardless, the package or packages may be supported by the PCB and may be directly or indirectly coupled to the interconnect 256. In some cases, the package or packages may be coupled to a PCB, and one or more modules for the memory components (e.g., for the DRAM 260) may also be coupled to the same PCB, which together can form a CXL type of memory device 108. This memory device 108 may be enclosed within a housing or may include such a housing. The components of the memory device 108 may, however, be fabricated, packaged, combined, and/or housed in other manners.

As illustrated in FIG. 2-2, the target 254, including the link controller 280 thereof, can be coupled to the interconnect 256. Each memory controller 258 of the multiple memory controllers 258-1 and 258-2 can also be coupled to the interconnect 256. Accordingly, the target 254 and each memory controller 258 of the multiple memory controllers MC 258-1 and MC 258-2 can communicate with each other via the interconnect 256. Each memory controller 258 is coupled to at least one DRAM 260. As shown, each respective memory controller 258 of the multiple memory controllers MC 258-1 and MC 258-2 is coupled to at least one respective DRAM 260 of the multiple DRAMs 260-1 and 260-2. Each memory controller 258 of the multiple memory controllers MC 258-1 and MC 258-2 may, however, be coupled to a respective set of multiple DRAMs 260 or other memory components.

The DRAMs 260 may incorporate die disablement logic 132, such as die disablement logic 132-1 and 132-2 (DDL 132-1 and DDL 132-2) that are incorporated within DRAM 260-1 and DRAM 260-2, respectively. Alternatively, and as further described below with regard to FIGS. 3-2 and 3-3, a common die disablement logic 132 may be operatively coupled with multiple DRAM 260 (e.g., one instance of die disablement logic 132 per memory controller 258, per memory channel, or per memory rank) to perform die disablement functions for multiple DRAMs 260. As described herein, the die disablement logic 132 may disable a die, such as at least part of a DRAM device 260 within a memory device 108 while enabling other dies to continue to operate. Thus, for example, if testing indicates that a die included in a package such as the DRAM 260-1 is unusable, the die disablement logic 132-1 may disable the DRAM 260-1. However, if the DRAM 260-2 is usable, the die disablement logic 132-2 does not disable the DRAM 260-2, thereby enabling the memory device 108 to operate using the dies that are available and usable, while still disabling at least one unusable die.

Each memory controller 258 can access at least one DRAM 260 by implementing one or more memory access protocols to facilitate reading or writing data based on at least one memory address. The memory controller 258 can increase bandwidth or reduce latency for the memory accessing based on the memory type or organization of the memory components, like the DRAMs 260. The multiple memory controllers MC 258-1 and MC 258-2 and the multiple DRAMs 260-1 and 260-2 can be organized in many different manners. For example, each memory controller 258 can realize one or more memory channels for accessing the DRAMs 260. Further, the DRAMs 260 can be manufactured to include one or more ranks, such as a single-rank or a dual-rank memory module. Each DRAM 260 may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 266 to the initiator 252. The memory access request 266 may be propagated over a bus or other interconnect that is internal to the host device 104. This memory access request 266 may be or may include a read request or a write request. The initiator 252, such as the link controller 278 thereof, can reformulate the memory access request into a format that is suitable for the interconnect 106. This formulation may be performed based on a physical protocol or a logical protocol (including both) applicable to the interconnect 106. Examples of such protocols are described below.

The initiator 252 can thus prepare a request 262 and transmit the request 262 over the interconnect 106 to the target 254. The target 254 receives the request 262 from the initiator 252 via the interconnect 106. The target 254, including the link controller 280 thereof, can process the request 262 to determine (e.g., extract or decode) the memory access request. Based on the determined memory access request, the target 254 can forward a memory request 268 over the interconnect 256 to a memory controller 258, which is the first memory controller 258-1 in this example, to the first DRAM 260-1. For other memory accesses, the targeted data may be accessed with the second DRAM 260-2 through the second memory controller 258-2.

The first memory controller MC 258-1 can prepare a memory command 270 based on the memory request 268. MC 258-1 can provide the memory command 270 to the DRAM 260-1 over an interface or interconnect appropriate for the type of DRAM or other memory component. The DRAM 260-1 receives the memory command 270 from MC 258-1 and can perform the corresponding memory operation. The memory command 270, and corresponding memory operation, may pertain to a read operation, a write operation, a refresh operation, and so forth. Based on the results of the memory operation, the DRAM 260-1 can generate a memory response 272. If the memory request 262 is for a read operation, the memory response 272 can include the requested data. If the memory request 262 is for a write operation, the memory response 272 can include an acknowledgment that the write operation was performed successfully. The DRAM 260-1 can return the memory response 272 to MC 258-1.

MC 258-1 receives the memory response 272 from the first DRAM 260-1. Based on the memory response 272, MC 258-1 can prepare a memory response 274 and transmit the memory response 274 to the target 254 via the interconnect 256. The target 254 receives the memory response 274 from MC 258-1 via the interconnect 256. Based on this memory response 274, and responsive to the corresponding request 262, the target 254 can formulate a response 264 for the requested memory operation. The response 264 can include read data or a write acknowledgment and be formulated in accordance with one or more protocols of the interconnect 106.

To respond to the memory request 262 from the host device 104, the target 254 can transmit the response 264 to the initiator 252 over the interconnect 106. Thus, the initiator 252 receives the response 264 from the target 254 via the interconnect 106. The initiator 252 can therefore respond to the "originating" memory access request 266, which is from the processor 110 in this example. To do so, the initiator 252 prepares a memory access response 276 using the information from the response 264 and provides the memory access response 276 to the processor 110. In this way, the host device 104 can obtain memory access services from the memory device 108 using the interconnect 106.

The interconnect 106 can be implemented in a myriad of manners to enable memory-related communications to be exchanged between the initiator 252 and the target 254. Generally, the interconnect 106 can carry memory-related information, such as data or a memory address, between the initiator 252 and the target 254. In some cases, the initiator 252 or the target 254 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 252, to transmit another memory request 262 to the target 254. The target 254 may return credits to "refill" a credit balance at the initiator 252. A credit-based communication scheme across the interconnect 106 may be implemented by credit logic of the target 254 or by credit logic of the initiator 252 (including by both working together in tandem).

The system 250, the initiator 252 of the host device 104, or the target 254 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 252 or the target 254 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 278 and the link controller 280 can be CXL controllers.

Example Techniques and Hardware

Figures 1, 3:
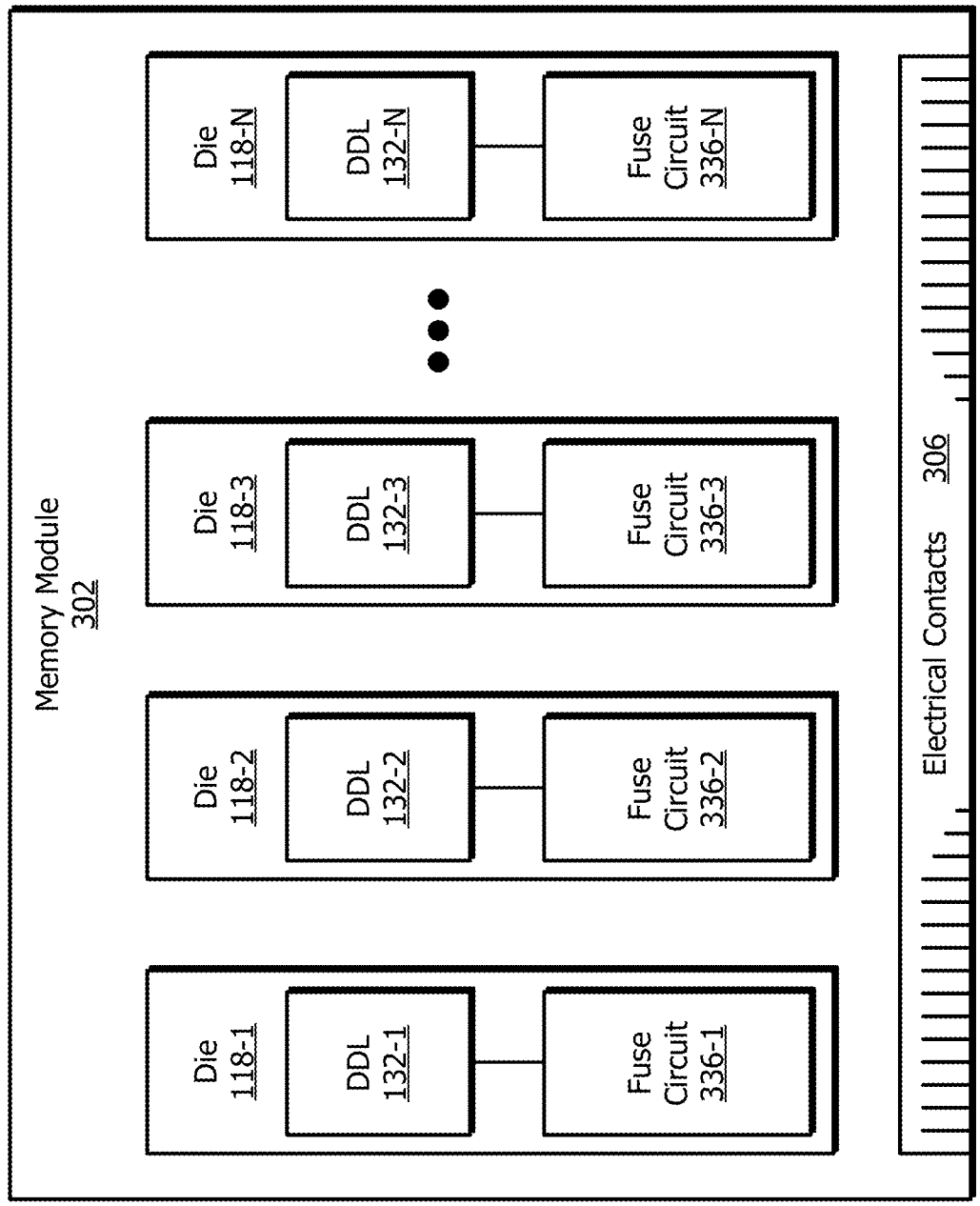
Figures 2, 3:
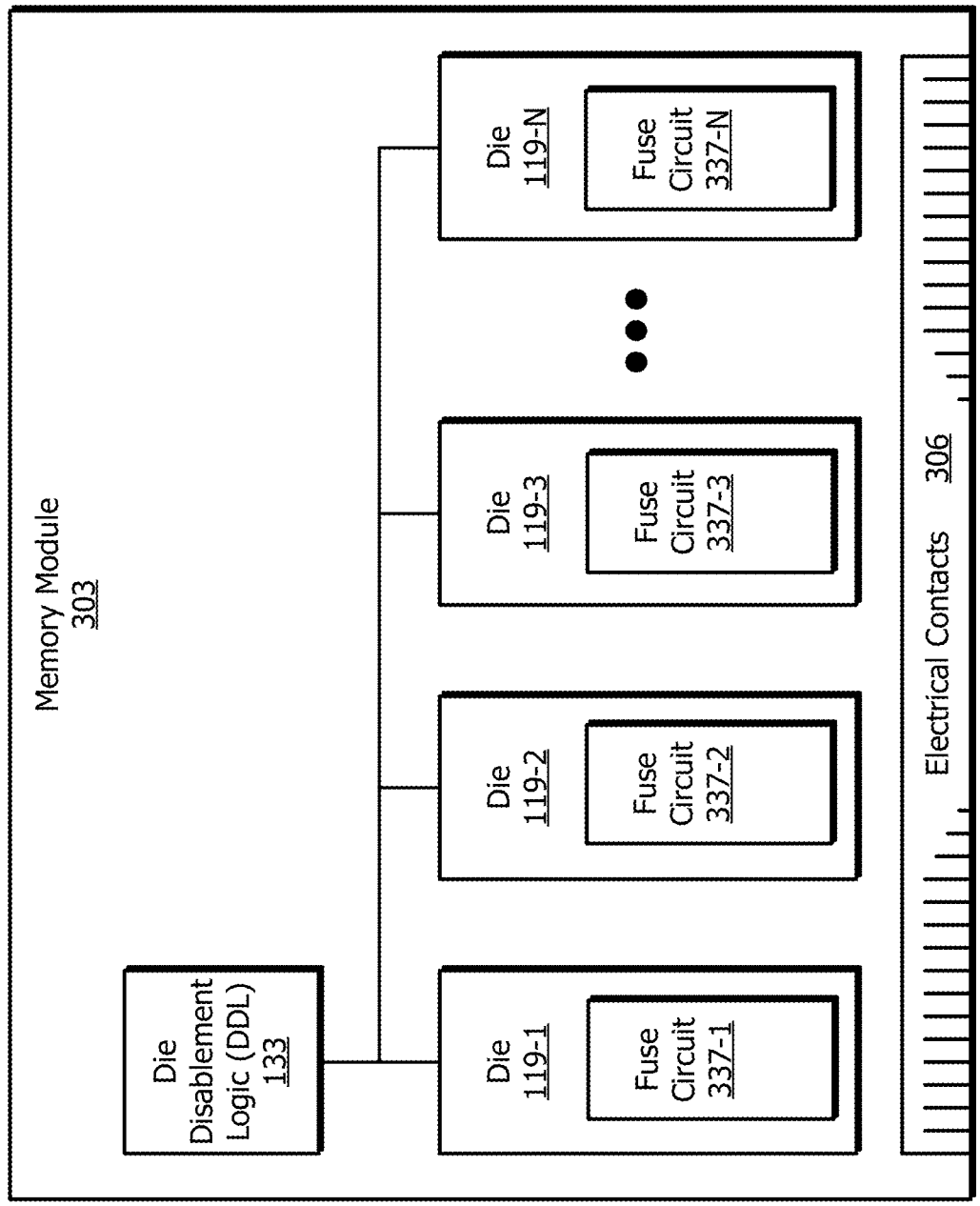
Figure 3:
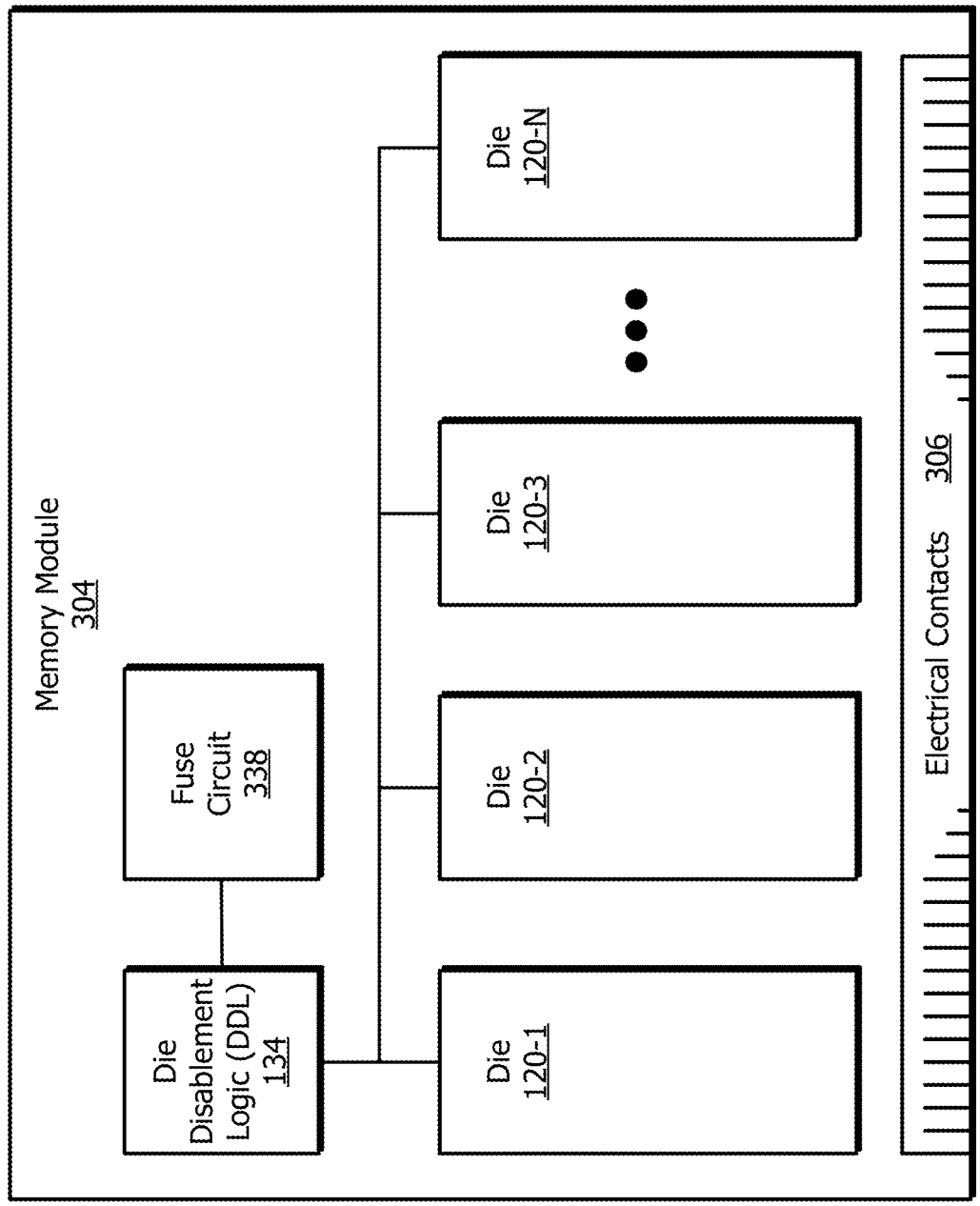

FIGS. 3-1 through 3-3 illustrate example memory devices featuring different implementations of die disablement. FIGS. 3-1, 3-2, and 3-3 show memory modules 302, 303, and 304, respectively, which include multiple memory dies formed on at least one package, such as an MDP. The memory module 302 of FIG. 3-1 includes separate die disablement logic circuits implemented within each of the individual memory dies 118-1 through 118-N. The memory modules 303 and 304 of FIGS. 3-2 and 3-3, respectively, implement common die disablement logic 133 and 134 that work with each of the individual memory dies 119-1 through 119-N and 120-1 and 120-N, respectively. In each case, "N" represents a positive integer corresponding to the final die in a sequence of 1 . . . N (1-N). The implementations are further described below.

Referring particularly to FIG. 3-1, the memory module 302 includes memory dies 118-1 through 118-N. The memory module 302 may include multiple interconnected MDPs or other packages or may be realized as a single MDP.

Only the dies 118-1 through 118-N, which may be on a single package are described, but it will be appreciated that the implementation can be replicated across multiple packages that may be included in the memory module 302. In any case, the one or more packages are coupled to electrical contacts 306 through which the memory module 302 communicates to other components of an apparatus 102 (FIG. 1) or a computing system 200 (FIG. 2-1).

Each of the dies 118-1 through 118-N includes individual die disablement logic 132-1 through 132-N and a fuse circuit 336-1 through 336-N, respectively. As previously described, each of the fuse circuits 336-1 through 336-N represents an example of a nonvolatile circuit, such as one or more nonvolatile memory cells in which a value may be stored. The nonvolatile circuit also may include, for example, a laser-severable link or a voltage-programmable link (e.g., programmable read-only memory) to persistently store the value. In any case, the value may represent if the associated die (or dies) passed or failed production testing or other testing, and the value may therefore indicate whether each of the associated dies is usable.

In operation, after power-up or a reset of the memory module 302, the die disablement logic 132-1 through 132-N of each of the dies 118-1 through 118-N receives the value stored by each respective fuse circuit 336-1 through 336-N within the respective die 118-1 through 118-N. The die disablement logic 132-1 through 132-N receives the value stored in the respective fuse circuit 336-1 through 336-N by, for instance, reading one or more values stored therein. Other circuitry may, additionally or alternatively, provide the one or more values to the die disablement logic 132, such as by being part of a fuse broadcasting procedure. Based on the respective value, the respective die disablement logic 132-1 through 132-N may disable each of the respective die 118-1 through 118-N.

In other words, if the value received by the die disablement logic 132 from the associated fuse circuit 336 indicates that the respective die 118 has passed inspection or is indicated to be usable, the die disablement logic can do nothing, or at least take no action that disables the die. Thus, the die disablement logic may allow the associated die to operate normally. However, if the value received by the die disablement logic from the respective fuse circuit indicates that the respective die has failed inspection, is faulty, or is otherwise indicated to be unusable, the die disablement logic can disable the respective die. This is further described below with reference to FIG. 3-2, as well as with reference to FIGS. 4-1 through 7-5 for various implementations. As a result, if the memory module 302 includes one or more unusable dies, the die disablement logic can disable the unusable die or dies while enabling the remaining dies to operate normally.

Referring particularly to FIG. 3-2, the memory module 303 includes memory dies 119-1 through 119-N, which may be combined into a single package. As described with the memory module 302 (FIG. 3-1), the memory module 303 may include multiple interconnected packages combined into a memory module. The one or more packages are coupled with electrical contacts 306 through which the memory module communicates with other components of an apparatus 102 (FIG. 1) or a computing system 200 (FIG. 2).

By contrast with the memory module 302 (FIG. 3-1), the memory module 303 includes a common die disablement logic 133 (e.g., common logic) communicatively coupled with each of the respective dies 119-1 through 119-N and fuse circuits 337-1 through 337-N, which are respectively incorporated within each of the respective dies. As previously described, each of the fuse circuits 337-1 through 337-N is an example of a nonvolatile circuit, such as one or more nonvolatile memory cells in which a value can be stored or another nonvolatile circuit that may represent whether the associated die passed or failed production testing or another type of testing that reflects whether the associated die is usable.

In example operations, after power-up or after a reset of the memory module 303, the die disablement logic 133 receives the respective value stored by each of the respective fuse circuits 337-1 through 337-N within the respective dies 119-1 through 119-N. Based on the respective value stored in each of the respective fuse circuits 337-1 through 337-N, the die disablement logic 133 can allow each of the respective dies 119-1 through 119-N to operate normally or can disable each of the respective dies 119-1 through 119-N as previously described with reference to the memory module 302 of FIG. 3-1.

Accordingly, one instance of "shared" or "common" die disablement logic 133 can individually disable each die 119 of the one or more of the dies 119-1 to 119-N. Although shown as a single line, the bus or other wires coupling the die disablement logic 133 to the multiple dies 119-1 to 119-N may include multiple wires or buses. In some cases, a separate set of wires may couple each respective die 119 to the die disablement logic 133. In other cases, a set of shared wires may couple the die disablement logic 133 to the multiple dies 119-1 to 119-N, with the single set of wires including an arbitration mechanism for sharing the wires.

Referring particularly to FIG. 3-3, the memory module 304 includes memory dies 120-1 through 120-N, which may be formed into a package. As described with memory modules 302 and 303 (FIGS. 3-1 and 3-2, respectively), the memory module 304 may include multiple interconnected packages combined into a memory module. The one or more packages are coupled with electrical contacts 306 through which the memory module communicates with one or more other components of an apparatus 102 (FIG. 1) or a computing system 200 (FIG. 2).

Like the memory module 303 (FIG. 3-2), the memory module 304 includes a common die disablement logic 134 communicatively coupled with each of the respective dies 120-1 through 120-N. By contrast with the memory module 303, the memory module 304 also includes a common fuse circuit 338, which is an example of a nonvolatile circuit (e.g., a common nonvolatile circuit for the memory module 304), such as one or more nonvolatile memory cells in which a value can be stored to represent whether each of the respective dies 120-1 through 120-N are usable.

In example operations, after power-up or a reset of the memory module 304, the die disablement logic 134 receives one or more values stored in the fuse circuit 338 for each of the respective dies 120-1 through 120-N. Based on the one or more values stored in the fuse circuit 338 for each of the respective dies 120-1 through 120-N, the die disablement logic 134 can allow each of the respective dies 120-1 through 120-N to operate normally or can disable each of the respective dies 120-1 through 120-N. This is previously described with reference to the memory module 302 of FIG. 3-1 and the memory module 303 of FIG. 3-2.

Although the die disablement logic and/or fuse circuits may be implemented within each individual die or be implemented collectively for a plurality of dies, for the sake of clarity, the following examples described with reference to FIGS. 4-1 through 7-5 depict separate die disablement logic and fuse circuits implemented within each die. However, collective or common die disablement logic and/or fuse circuits can be employed to operate in the same manner or in analogous manners as described below.

Figures 1, 4:
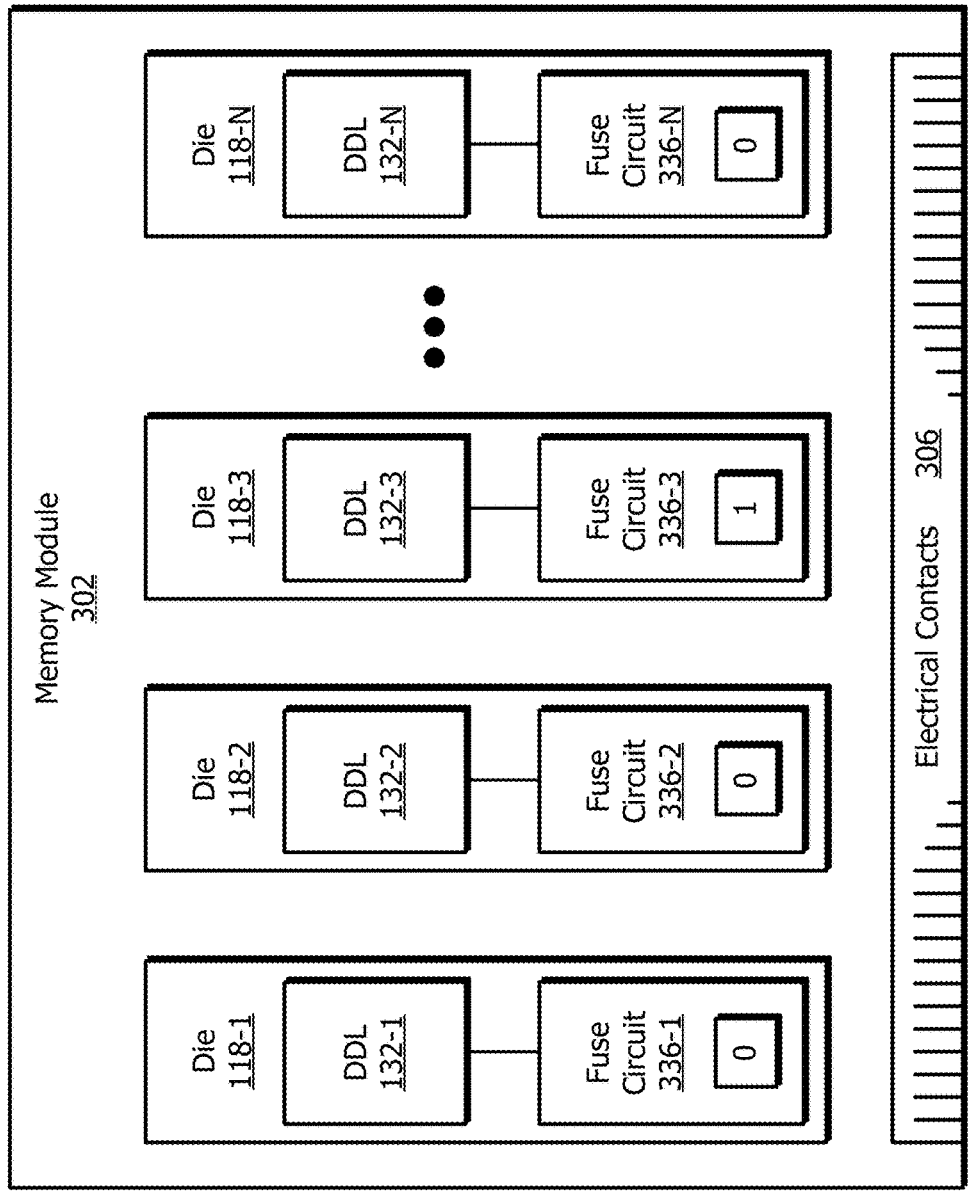
Figures 2, 4:

Referring to FIGS. 4-1 and 4-2, operation of the die disablement logic 132-1 through 132-N is described with regard to the memory module 302 (also of FIG. 3-1) receiving a reset signal. Referring particularly to FIG. 4-1, at time $t_{Reset}$, the fuse circuits 336-1 through 336-N store values indicating the usability of each die 118 of the respective dies 118-1 through 118-N. For purposes of this example, fuse circuits 336-1, 336-2, and 336-N each store a low value, represented by a "0," to indicate that each of the respective dies 118-1, 118-2, and 118-N has passed its testing or has otherwise been determined to be usable. By contrast, the fuse circuit 336-3 stores a high value, represented by a "1," to indicate that the die 118-3 has failed its testing or has otherwise been determined to be unusable.

Because the fuse circuits 336-1 through 336-N are non-volatile circuits, the values stored therein persist even when power is not supplied to the memory module 302 and after the memory module 302 is reset. Thus, regardless of how many times the memory module is reset, the respective value indicative of the usability of each respective die 118 of the multiple dies 118-1 through 118-N remains available. Although particular values (e.g., low versus high) are described as representing particular die statuses (e.g., usable versus unusable), these values or statuses may be swapped or otherwise modified for different implementations.

Referring particularly to FIG. 4-2, after time $t_{Reset}$, each respective die disablement logic instance of the die disablement logic 132-1 through 132-N enables or disables each respective die 118-1 through 118-N based on the respective value received from the respective fuse circuit 336-1 through 336-N. Based on the values stored by the fuse circuits 336-1, 336-2, and 336-N indicating that the respective dies 118-1, 118-2, and 118-N are usable, the die disablement logic 132-1, 132-2, and 132-N enable the respective dies 118-1, 118-2, and 118-N to remain operable. As a result, the respective dies 118-1, 118-2, and 118-N are depicted in FIG. 4-2 in the same solid lines as shown in FIG. 4-1. By contrast, based on the value received from the fuse circuit 336-3 indicating the die 118-3 is unusable, the die disablement logic 132-3 disables the die 118-3, which is indicated by the die 118-3 being represented in dashed lines in FIG. 4-2. Accordingly, the die 118-3 is disabled while the other dies 118-1, 118-2, and 118-N remain enabled. This allows the memory module 302 to function without the die 118-3 interfering with the operation of the other die, albeit with a partial amount of the manufactured memory being available for operational use. Thus, despite the presence of the unusable die 118-3, the memory module 302 of at least one MDP is still partially usable.

Figures 1, 5:
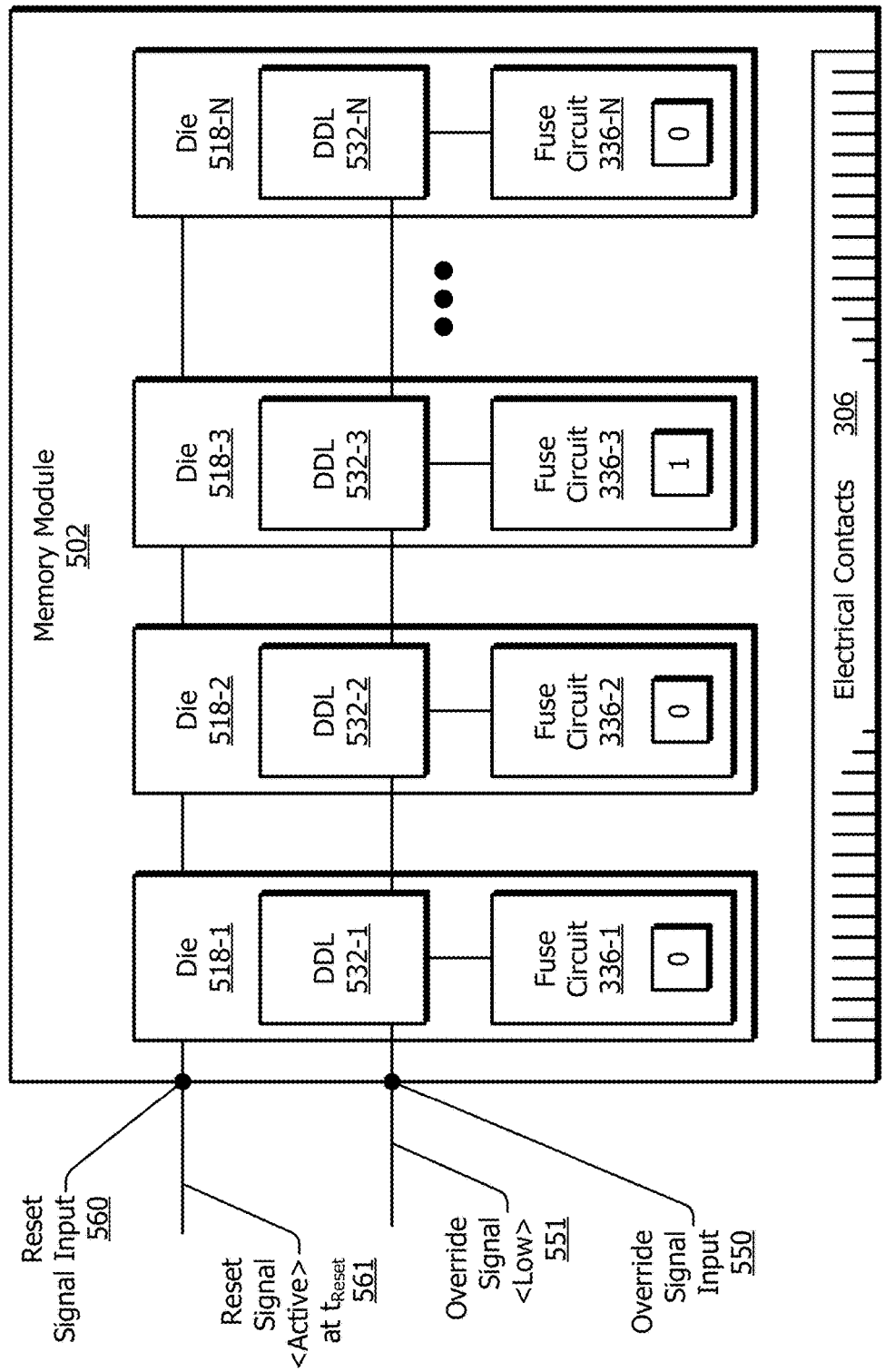
Figures 2, 5:
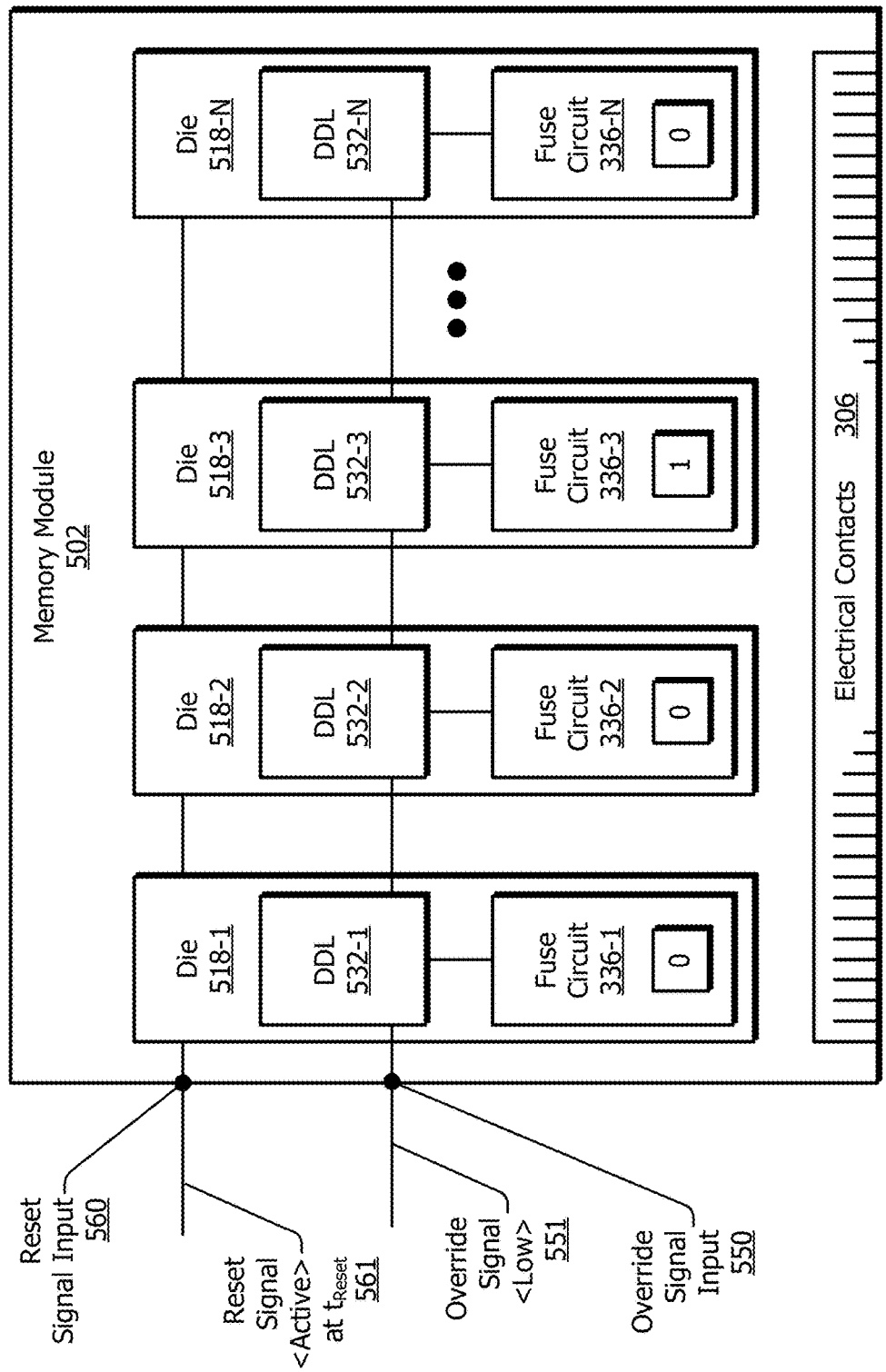

In various implementations, die disablement may be selectively enabled or disabled, for example, to enable a tester, engineer, or other operator to prevent die disablement logic from disabling one or more dies. By overriding the die disablement logic, the operator can perform further testing, debugging, or other operations of the one or more dies. In various implementations, enabling or disabling of the die disablement logic may be performed following a power-up or a receipt of a reset signal. In FIGS. 5-1 and 5-2, the variable for a reset time "$t_{Reset}$" is used to illustrate the presentation of an override signal relative to the receipt of a reset signal at $t_{Reset}$. As further described below with reference to FIGS. 6-1 through 7-5, the ability to selectively allow or prevent operation of (e.g., to selectively enable or disable, respectively) the die disablement logic may be restricted to a delay interval following receipt of the reset signal, but no such time limit applies to the examples of FIGS. 5-1 and 5-2.

Referring to FIG. 5-1, a memory module 502 can be similar to the memory module 302 of FIG. 3-1, 4-1, or 4-2, except that the memory module 502 and the die disablement logic 532-1 through 532-N are responsive to an override signal 551 that may be used to selectively allow or prevent operation of the die disablement logic 532-1 through 532-N. In the following examples, when the override signal 551 presents an, e.g., high value, the die disablement logic 532-1 through 532-N is allowed to enable or disable the respective die 518-1 through 518-N based on the value stored in the respective fuse circuit 336-1 through 336-N. By contrast, when the override signal 551 presents an, e.g., low value, the die disablement logic 532-1 through 532-N is prevented from disabling the respective die 518-1 through 518-N regardless of the value stored in the respective fuse circuit 336-1 through 336-N. The override signal 551, for example, may be presented via a signal input, such as an override input 550 (e.g., a test mode register set (TMRS) input) or another signal input. In various implementations, the override signal 551 may be a global signal to collectively allow or prevent operation of (e.g., collectively enable or disable) the die disablement logic 532-1 through 532-N of all the dies 518-1 through 518-N, or the override signal 551 may be independently addressable to each of the die disablement logic 532-1 through 532-N of selected one(s) of the dies 518-1 through 518-N.

Because the fuse circuits 336-1 through 336-N are non-volatile circuits, the values stored therein may not be overwritable. For example, if the nonvolatile circuits include laser-severable linkages or one-time voltage-programmable circuits, the values stored therein, once set, cannot be overwritten. However, although the values stored in the fuse circuits 336-1 through 336-N may not be overwritten, the values, or at least action(s) based on the values, may be operationally overridden by selectively preventing operation of (e.g., by selectively disabling) the die disablement logic 532-1 through 532-N by changing the value of the override signal 551, as further described below.

In the example of FIG. 5-1, the override signal 551 presented via the override signal input 550 presents a low value which, as previously described, prevents operation of (e.g., disables) the die disablement logic 532-1 through 532-N. As a result, the die disablement logic 532-3 does not disable the die 518-3 despite the high value stored in the fuse circuit 336-3 of die 518-3, which high value indicates that the die 518-3 is unusable. If the override signal 551 does not present a low value, the high value stored in the fuse circuit 336-3 causes, or at least results in, the die disablement logic 532-3 disabling the die 518-3, as described with reference to FIG. 4-2. However, in the illustrated example, the low value of the override signal 551 prevents operation of the die disablement logic 532-3 thereby causing the die 518-3 to remain enabled.

Referring to FIG. 5-2, at a time after $t_{Reset}$, because the signal 551 (also of FIG. 5-1) has "already" prevented the die disablement logic 532-3 from disabling the die 518-3, the die 518-3 remains active as indicated by die 518-3 being depicted in solid lines. It will be appreciated that other implementations of the die disablement logic, such as those described with reference to FIGS. 3-2 and 3-3 which utilize a common die disablement logic and/or a common fuse circuit, also may be responsive to an override signal to control whether the die disablement logic is allowed to disable or prevented from disabling dies for which a fuse circuit stores a value indicating that the dies are unusable. Thus, by configuring the die disablement logic 532-1 through 532-N to respond to the override signal 551, dies that might otherwise have been disabled by the die disablement logic 532-1 through 532-N based on a stored value may remain active for testing, debugging, or other purposes.

Die disablement logic may be configured to respond to a signal when the override signal 551 is presented within a specified interval, such as a delay interval that follows receipt of a reset signal, but not during other time periods. By imposing a time limit that is restricted to a delay interval, a tester or engineer is provided a limited opportunity to selectively enable or disable die disablement logic with respect to disabling one or more dies based on values stored within the fuse circuitry upon receipt of a reset signal. In other words, the delay interval enables a tester or engineer a limited time during which to disable the die disablement logic to prevent the logic from disabling a respective die based on a respective value stored in the fuse circuitry. Otherwise, responsive to expiration of the delay interval, the die disablement logic is permitted to disable the die based on the value. Limiting the time during which the override signal 551 may be presented with effect may prevent a spurious signal from undesirably enabling a circuit or die that was intended to be disabled, or vice versa.

Figures 1, 6:
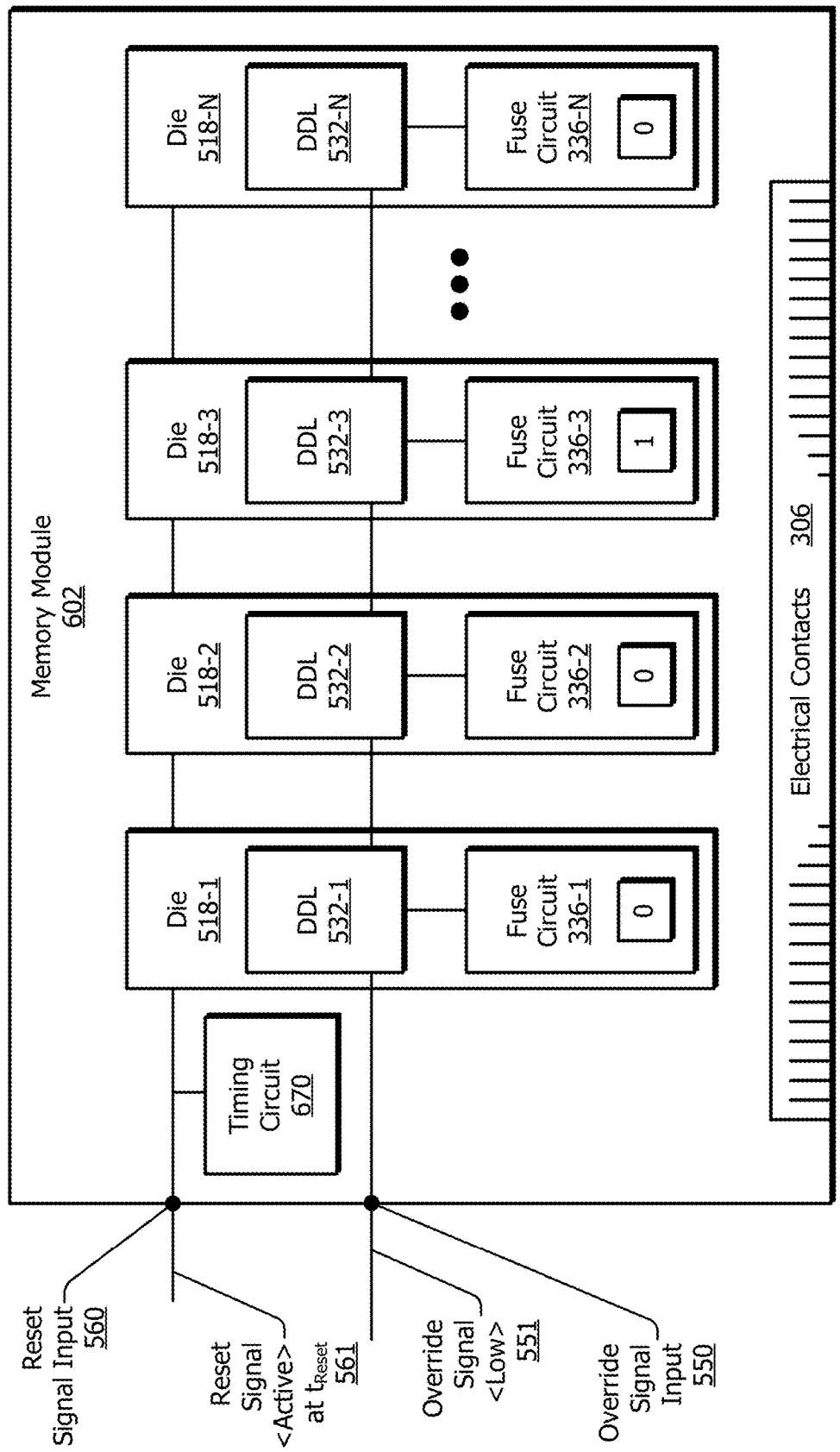
Figures 2, 6:
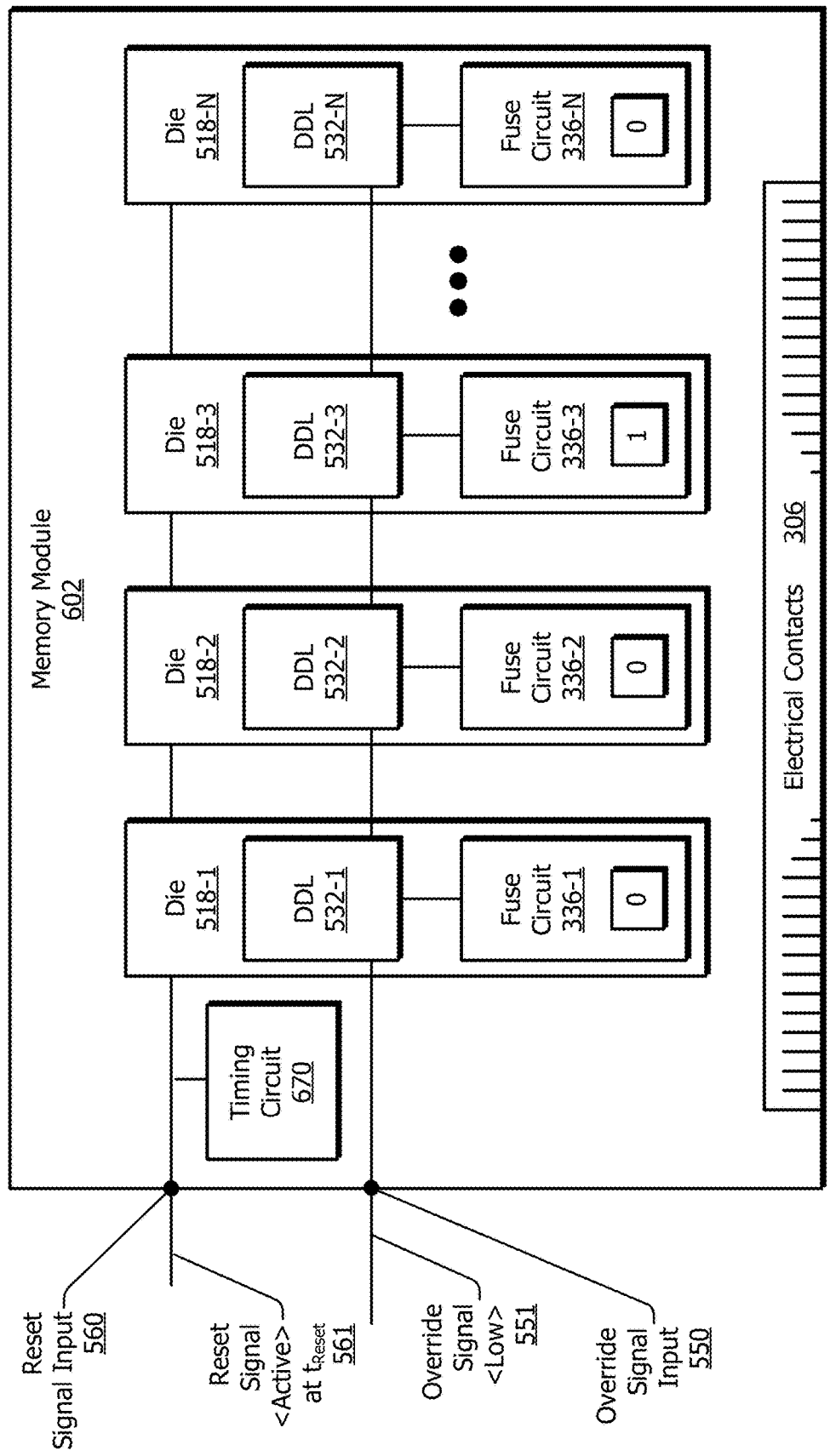
Figures 3, 6:
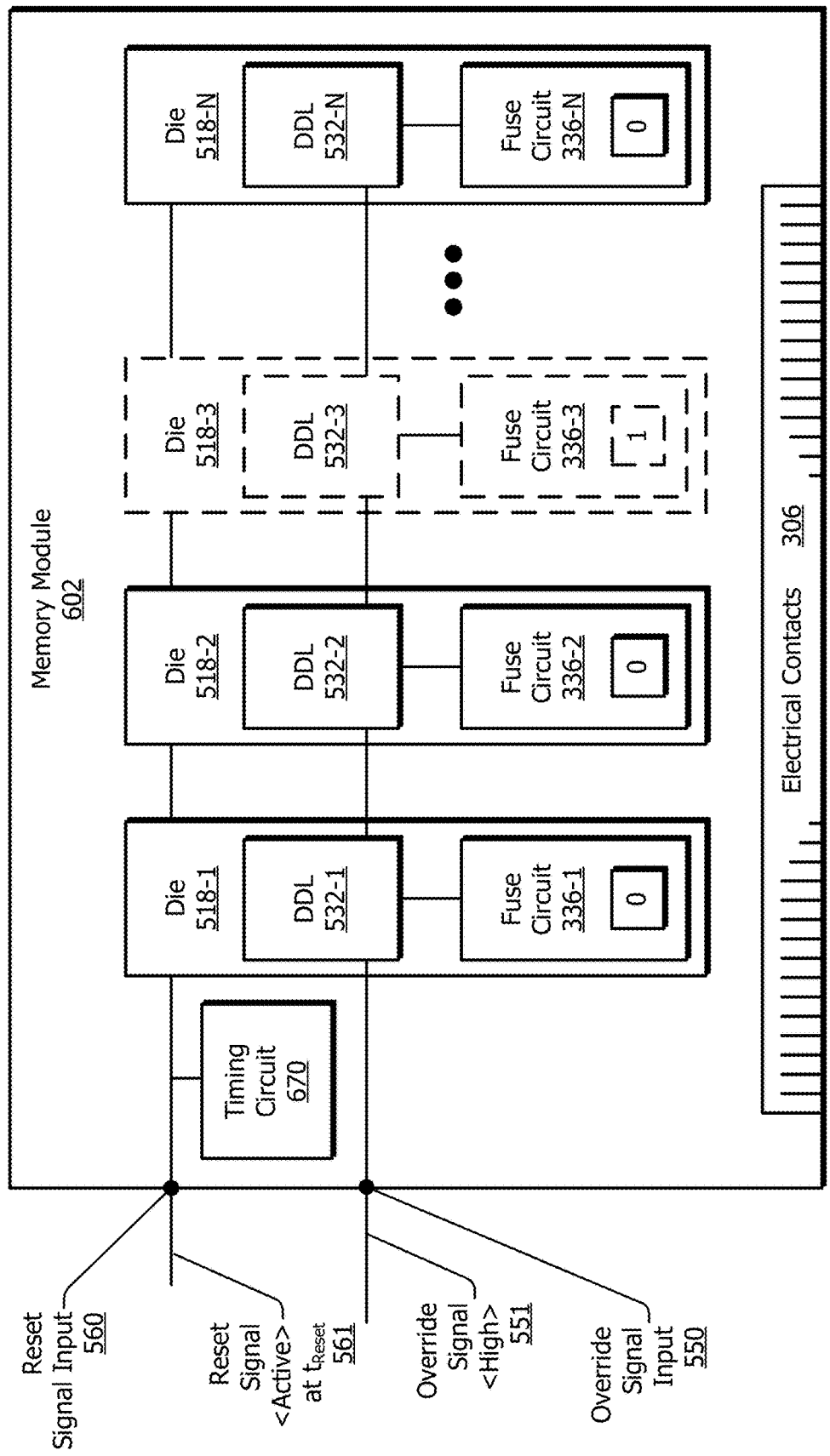
Figures 4, 6:
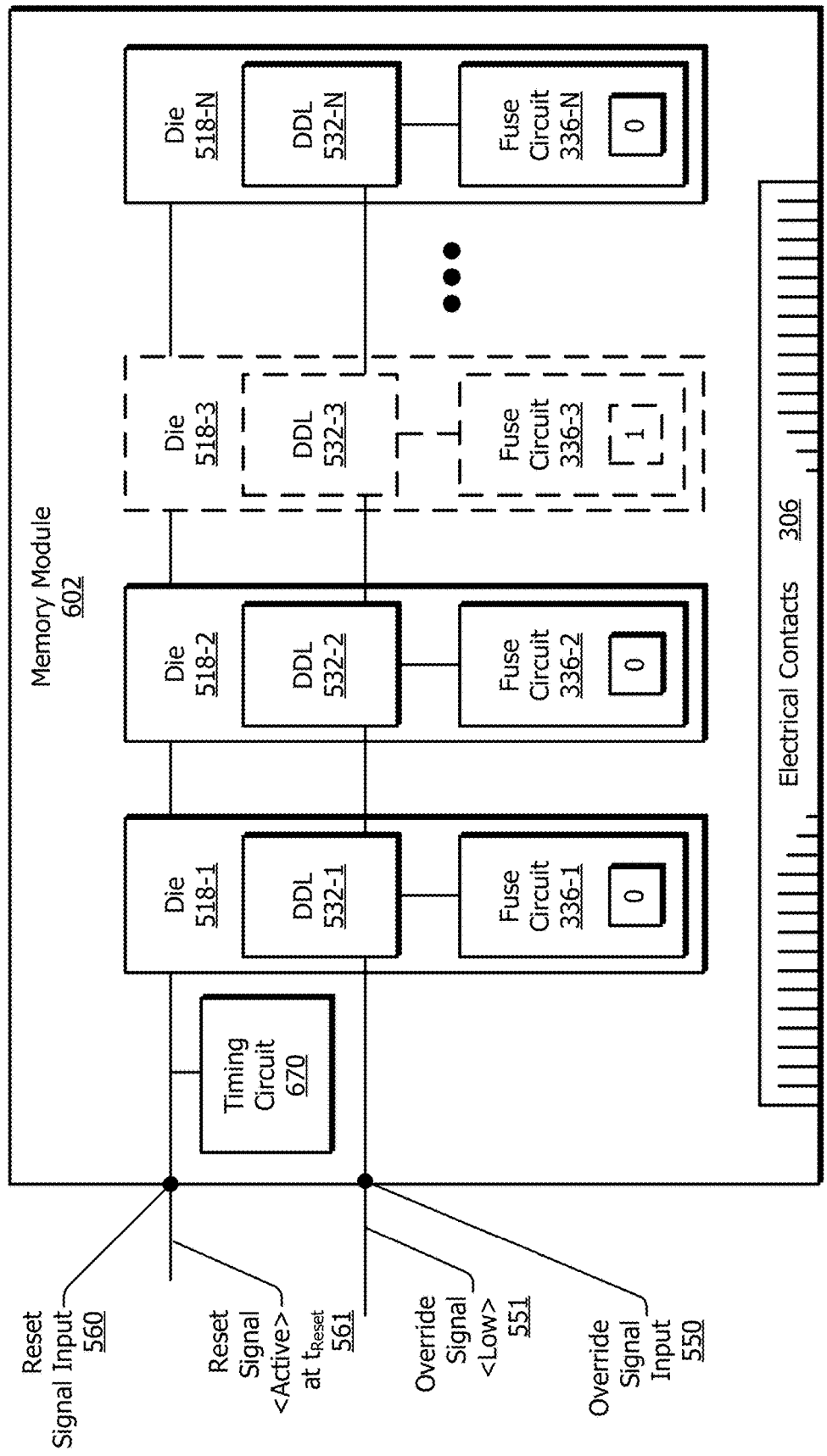

Referring to FIG. 6-1, the memory module 602 may be similar to that of the memory module 502 that is responsive to an override signal 551 at an override input 550 (e.g., a TMRS signal input) upon receipt of a reset signal at a reset input 560 (e.g., a reset signal input 560). In some cases, the memory module 602 is configured to be responsive to the signal within a delay interval and unresponsive after (or before) the delay interval. A timing circuit 670 incorporated within the memory module 602, such as at least part of a timing circuit that is used for self-refresh operations, may be used to clock or time the delay interval. In various implementations, the delay interval may include a default delay interval, or the delay interval may be set to a different interval, as further described below with reference to FIGS. 7-1 through 7-5. In FIGS. 6-1 through 6-4, the designation for a time delay or a delay interval "$t_{Delay}$" is used to indicate a time representing the lapse or expiration of the delay interval. For these implementations, at a time before $t_{Delay}$ expires (e.g., but after a power cycling or application of a reset signal that starts the delay interval), an operator may successfully set or change the override signal 551, but the operator cannot successfully set or change the override signal 551 so as to prevent operation of the die disablement logic 532 after $t_{Delay}$.

As shown in FIG. 6-1, the override signal 551 presents a low signal at the override signal input 550. The low value of the signal 551 prevents the die disablement logic 532-3 from disabling the die 518-3 as a result of the high value stored in the fuse circuit 336-3 of the die 518-3. In certain aspects, assertion, election, or activation of the override signal 551 may be operative only between a time after receipt of a reset signal 561 at the reset input 560 and before the delay interval $t_{Delay}$ lapses, expires, or transpires. Referring to FIG. 6-2, because the override signal presents a disabling low value within or before expiration of the delay interval $t_{Delay}$, the die disablement logic 532-3 is disabled, or otherwise prevented from operating to disable the die 518-3, and the die 518-3 thus remains active (as represented by the die 518-3 being depicted in solid lines) after the delay interval $t_{Delay}$ lapses.

As further shown in FIG. 6-2, if the override signal 551 were subsequently changed to present a high value via the override signal input 550 after the delay interval has lapsed, the die 518-3 is not disabled even if the value stored in the fuse circuit 336-3 indicates the die 518-3 is unusable. In various implementations, the die disablement logic 532-3 may only be responsive to the override signal 551 if or while the override signal 551 is presented during the delay interval following receipt of a reset signal at the reset input 560 (or after a power-on operation). After the delay interval lapses, whether the die disablement logic 532-3 has been disabled or not previously by the override signal 551, a change in the override signal 551 that is applied subsequent to the lapsing of the delay interval $t_{Delay}$ does not change the operational status of the die 518-3. If a next delay interval $t_{Delay}$ is started, such as responsive to a next reset signal 561 being received at the reset input 560, the die 518-3 may be enabled or disabled according to the associated stored value from the fuse circuit 336-3 based also on the value presented by the override signal 551 before the lapse of the next delay interval $t_{Delay}$.

Referring to FIG. 6-3, the override signal 551 presented at the override signal input 550 before the lapse of the delay interval $t_{Delay}$ includes a high value to permit operation of (e.g., to enable) the die disablement logic 532-3 of the die 518-3 (and other die disablement logic). Thus, the override signal 551 allows the die disablement logic 532-3 to disable the die 518-3 as a result of the high value stored in the fuse circuit 336-3 for the die 518-3. Referring to FIG. 6-4, after lapse of the delay interval $t_{Delay}$, the tester or engineer changes the override signal 551 to present a low value in an attempt to disable the die disablement logic 532-3. However, as shown in FIG. 6-4, because the low value of the signal 551 is presented after the lapse of the delay interval $t_{Delay}$, the change in the override signal 551 has no effect. Because the value of the override signal 551 was high during the delay interval $t_{Delay}$, the die disablement logic 532-3 caused the die 518-3 to become inactive based on the value stored in the fuse circuit 336-3, as represented by the die 518-3 being depicted in dashed lines. Application of a low, disabling value of the override signal 551 after expiration of the delay interval $t_{Delay}$ does not change the state of the die 518-3 in these example implementations.

Figures 1, 7:
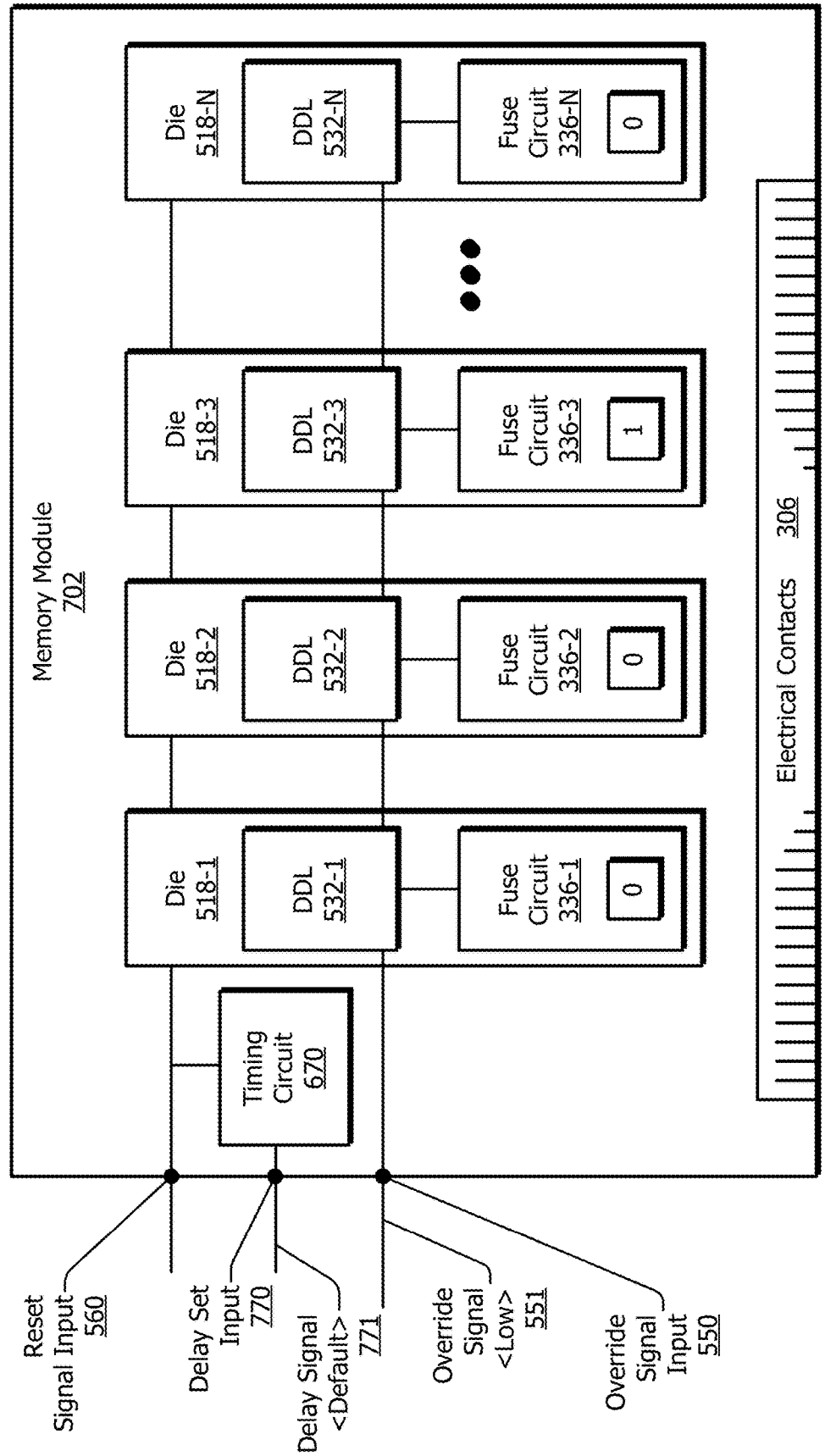
Figures 2, 7:
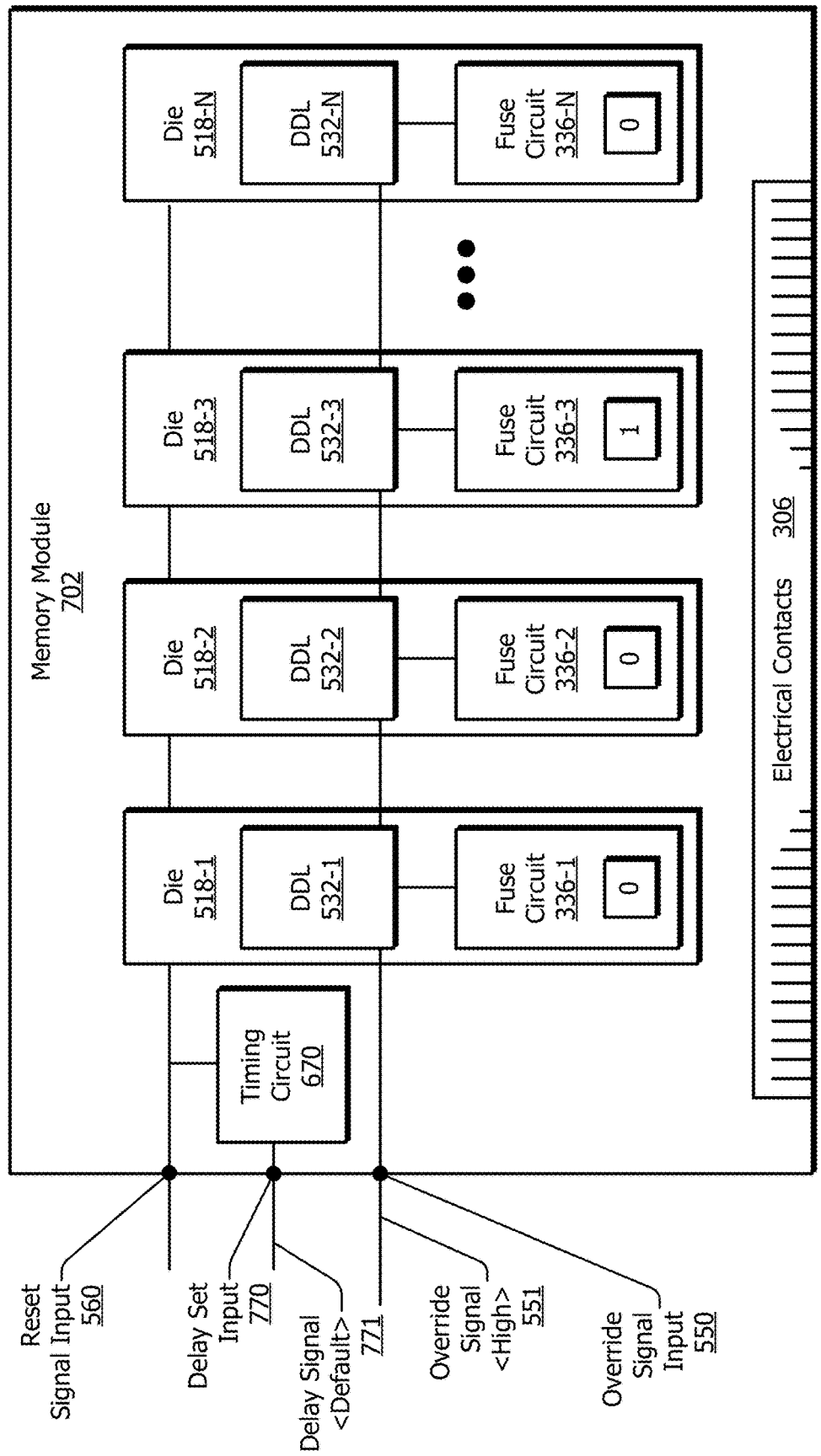
Figures 3, 7:
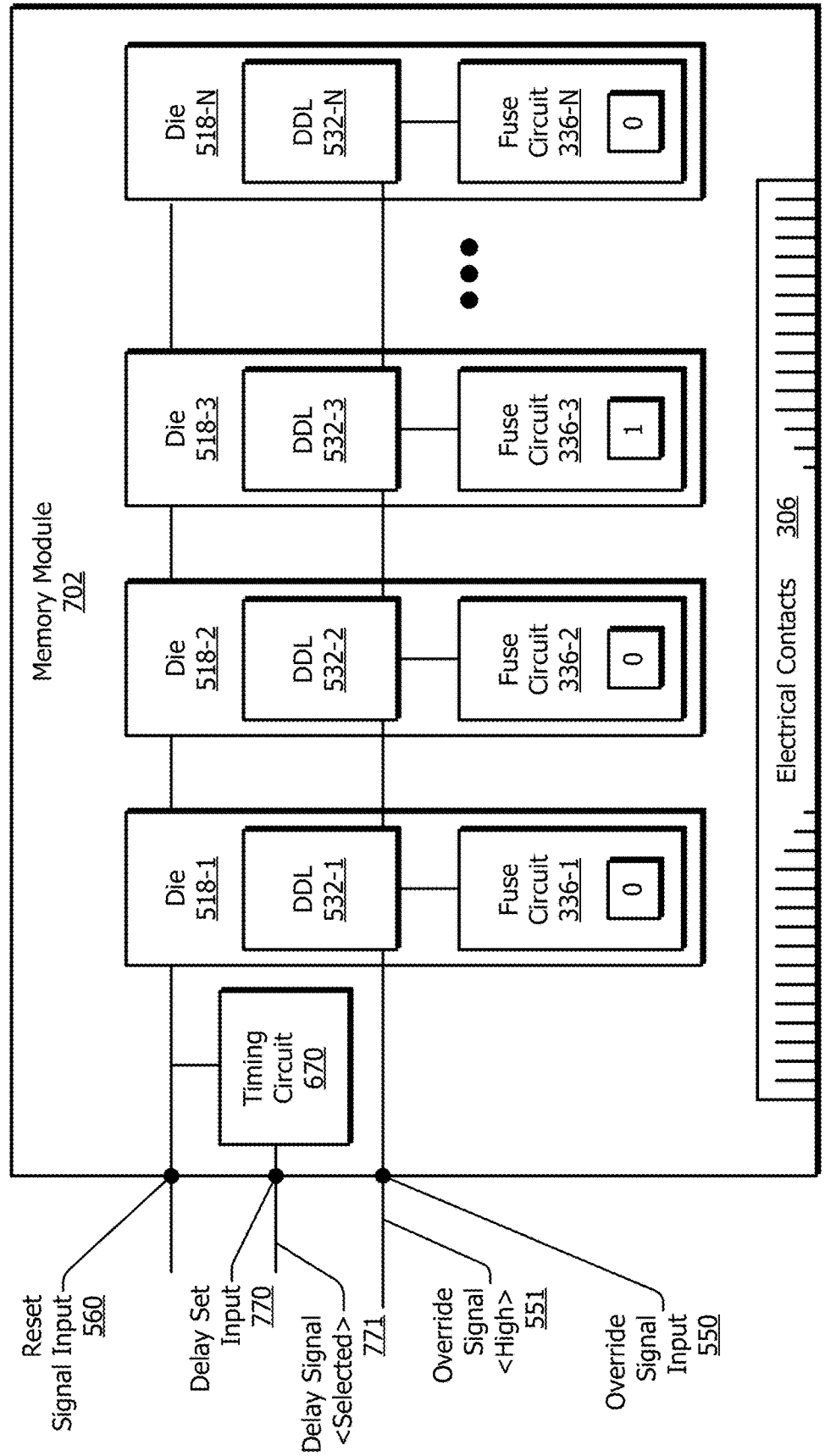
Figures 4, 7:
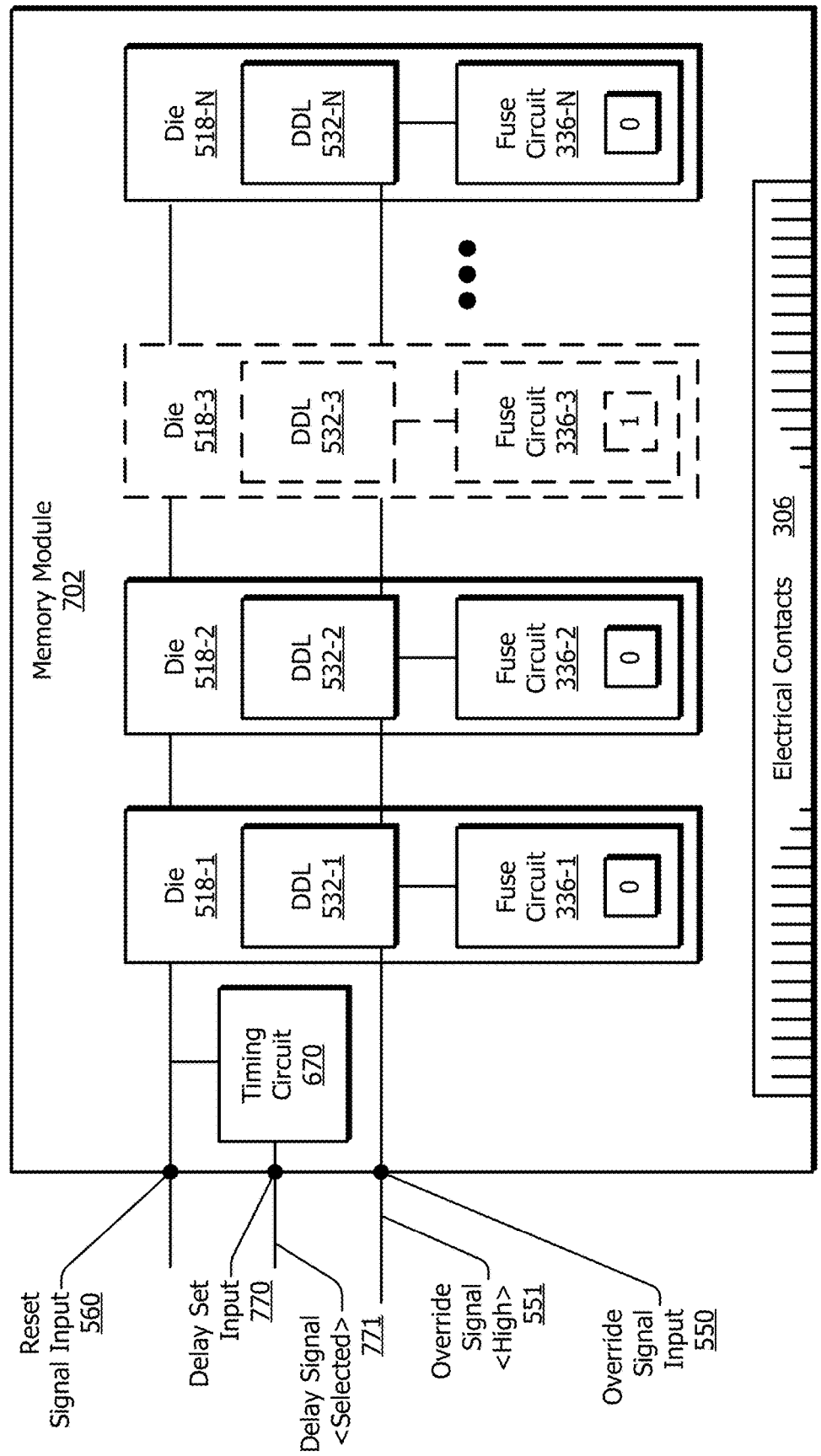
Figures 5, 7:
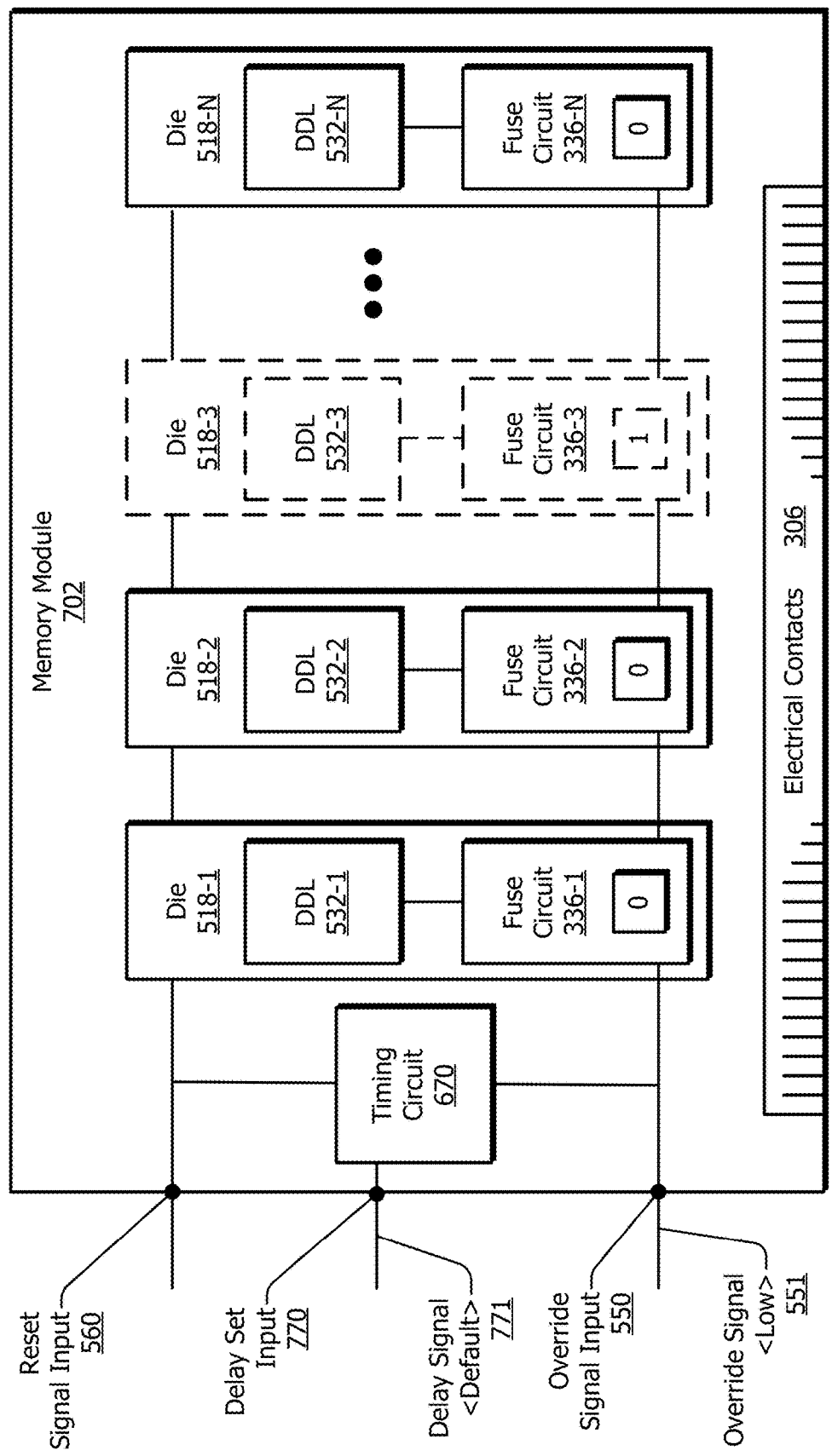

Various implementations may be configured to enable a tester or engineer to change the length of the delay interval. A memory module 702 may include a delay input 770 (e.g., a delay set input 770) to enable changing the delay interval, such as by allowing a selection of a time period for the delay between two or more time periods. For example, a default delay interval may be in the range of 10 milliseconds (ms). However, the tester or engineer may desire to change the delay interval to a different value, such as an interval corresponding to an initialization interval, such as the 5 ms $t_{INIT3}$ interval observed in some memory specifications. The tester or engineer may make the change by presenting a signal, including one or more signal bits, to the delay input 770. In FIGS. 7-1 through 7-5, the variable "$t_{Delay}$" is used to represent a default delay interval while "$t_{Delay}'$" (time delay 'prime') is used to represent a selectable delay interval. The selectable delay interval $t_{Delay}'$ may be shorter or longer than the default interval $t_{Delay}$. For purposes of the examples of FIGS. 7-1 through 7-5, it is assumed that the selectable delay interval is shorter than the default delay interval.

Referring to FIG. 7-1, a delay signal 771 specifying the default delay $t_{Delay}$ is presented at the delay input 770. The delay signal 771 may include a single bit for which a high value may specify the default interval and the low value may specify a selected interval, or vice versa. The delay signal 771 also may include multiple bits to permit a selection of a delay interval from the default interval or a plural number of selectable delay intervals. The delay signal 771 may represent a separate (e.g., external) signal or, for example, may be included in a multi-bit signal presented via the override signal input 550. Alternatively, the delay signal 771 may be produced from one or more bits stored in a memory (e.g., in a nonvolatile circuit, such as a fuse) of the die. Thus, although depicted differently in FIGS. 7-1 to 7-5, the delay signal 771, which can select a length of the delay interval, may be an "internal" signal with respect to the die. The delay signal 771 can be produced at least partially by a nonvolatile circuit, such as a fuse circuit 336.

In the example of FIG. 7-1, the override signal 551 presented at the override signal input 550 includes a low value to prevent operation of (e.g., to disable) the die disablement logic 532-3 and, thus, prevent the die disablement logic 532-3 from disabling the die 518-3 regardless of (e.g., despite) the value maintained in the fuse circuit 336-3 indicating that the die 518-3 is unusable. The override signal 551 is presented at a low, disabling value at a time before a lapse of the shortened, selectable delay interval $t_{Delay}'$ and the default delay interval $t_{Delay}$. Referring to FIG. 7-2, after the passage of the delay interval $t_{Delay}$, the override signal 551 is changed to drive a high value to the die disablement logic 532-3. However, because the delay interval $t_{Delay}$ (which, in this example, is longer than the selected delay interval $t_{Delay}'$) has lapsed, the change in the override signal 551 is too late to cause, allow, or permit the die disablement logic 532-3 to disable the die 518-3. Because the override signal 551 presenting a low value was applied during the default delay interval (e.g., before t>$t_{Delay}$), die 518-3 remains active after the default interval $t_{Delay}$ lapses, as represented by the die 518-3 being depicted in solid lines.

Referring to FIG. 7-3, by contrast, a delay signal 771 specifying the selected delay interval $t_{Delay}'$ is presented at the delay input 770. The override signal 551 presented at the override signal input 550 presents a high value that allows the die disablement logic 532-3 to disable the die 518-3 based on the value stored in the fuse circuit 336-3. Referring to FIG. 7-4, at a time after the selected delay interval $t_{Delay}'$ lapses, but before the longer default interval $t_{Delay}$ lapses, the override signal 551 presented at the override signal input 550 is changed to a low value that would prevent operation of (e.g., disable) the die disablement logic 532-3 and, thus, prevent the die disablement logic 532-3 from disabling the die 518-3—if the value of the override signal 551 were timely presented. However, because the override signal 551 presented a high value during the selected interval $t_{Delay}'$, the die disablement logic 532-3 was enabled or allowed to disable the die 518-3 based on the value maintained in the fuse circuit 336-3 (as represented by the die 518-3 being depicted in dashed lines).

Referring to FIG. 7-5, it will be appreciated that, although the override signal 551 was changed to present a low value that would disable operation of the die disablement logic 532-3 to prevent it from disabling the die 518-3 before the lapse of the default interval $t_{Delay}$, the die 518-3 nonetheless remains active. This is because the shorter, selected interval $t_{Delay}'$ had been selected via the delay signal 771. Accordingly, it is the (in this case, shorter) selected interval $t_{Delay}'$ that limits when the value presented by the override signal 551 is operative to affect the operation of the die disablement logic 532-3. Changing the value of the override signal 551 from the high value to the low value after the lapse of the selected delay interval $t_{Delay}'$ (e.g., after the delay interval $t_{Delay}$) does not "undo" the die disabling already performed, or in the process of being performed, by the die disablement logic 532-3.

Thus, the die disablement logic may automatically disable a die, some circuitry, or another device based on a value stored in a fuse circuit or other nonvolatile circuit, as described with reference to FIGS. 4-1 and 4-2. In various implementations, the die disablement logic may respond to an override signal to prevent the die disablement logic from automatically disabling the die or other circuit based on the value stored in the fuse circuit or other nonvolatile circuit, as described with reference to FIGS. 5-1 and 5-2. In various implementations, the time after a reset or power-on during which a signal may successfully enable or disable operation of the die disablement logic may be limited by a delay interval, as described with reference to FIGS. 6-1 through FIGS. 7-5. The length of the delay interval may be fixed, as described for some aspects with reference to FIGS. 6-1 through 6-4. Alternatively, the delay interval may be selectable between a default interval and one or more other intervals, as described with reference to FIGS. 7-1 through 7-5.

Figures 1, 8:
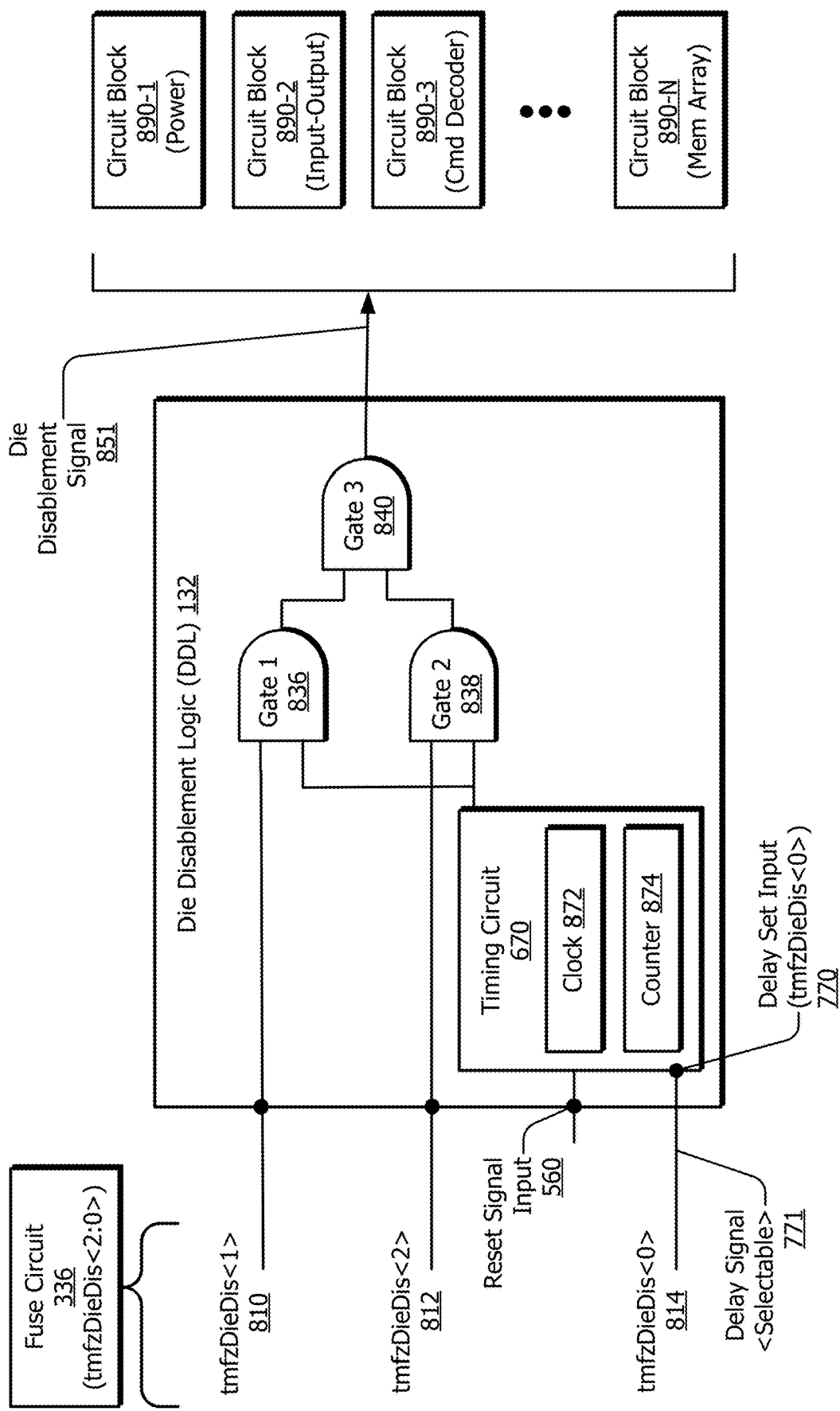
Figures 2, 8:
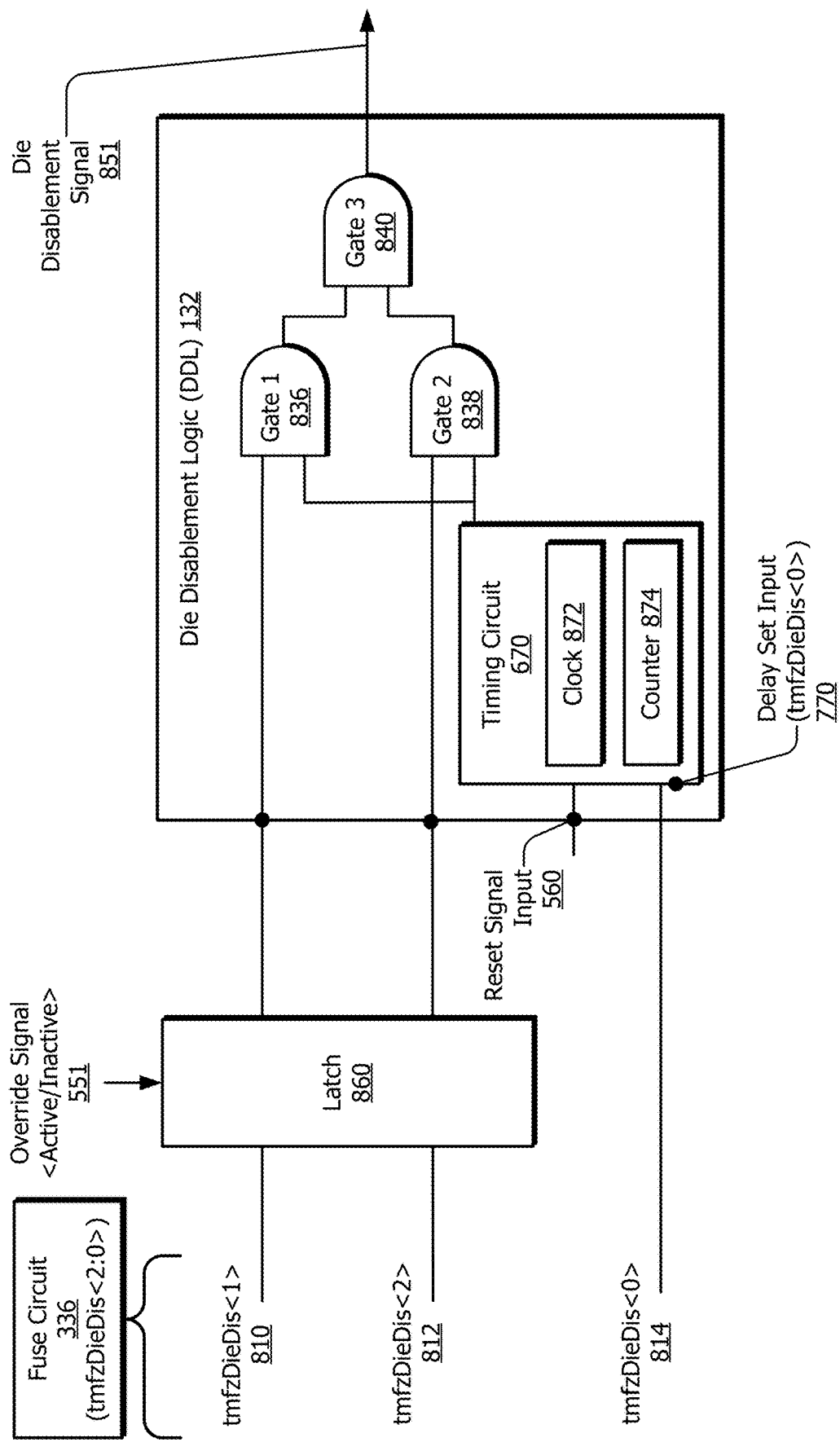

Referring to FIG. 8-1, die disablement logic 132 may include logic gates, timing circuitry, and/or other components to implement and/or control die disablement. In various implementations, as previously described, the die disablement logic 132 may be configured to conditionally generate a die disablement signal 851 based on at least one value stored in a fuse circuit 336 for a particular die (not explicitly represented in FIG. 8-1). Operation or efficacy of the die disablement logic 132, as also previously described, may be selectively allowed or prevented (e.g., enabled or disabled) by an override signal 551, which is shown in FIG. 8-2. In various implementations, to prevent inadvertent or unintentional activation of the die disablement logic 132, a multiple-bit signal, which may include separate signal paths, can be used to activate the die disablement logic 332. For example, a two-bit signal (e.g., tmfzDieDis<2:1>) that includes two "high" bits may be used to activate the die disablement logic 132 to disable a die, as is described further below. If one of the bits of the two-bit signal is a low bit, then the die disablement logic 132 is not activated in these examples.

Referring further to FIG. 8-1, in some implementations, an activation signal from the fuse circuit 336 (or other nonvolatile circuit) includes two bits or two separate signals or signal paths, which are indicated by tmfzDieDis<1> 810 and tmfzDieDis<2> 812. In certain cases, each of these separate signal paths is to provide a separate high-value signal to and/or within the die disablement logic 132 to enable die disablement. Each of tmfzDieDis<1> 810 and tmfzDieDis<2> 812 is respectively received at an input of one of gate "1" 836 and gate "2" 838, along with an output of the timing circuit 670. In various implementations, the timing circuit 670 is used to clock the delay interval (e.g., a delay interval $t_{Delay}$), which is described herein.

As shown, the timing circuit 670 may include, for instance, a clock 872 (or may otherwise receive a clock signal) and a counter 874 to measure a default delay interval or a selected delay interval, as previously described. Alternatively, to save area and/or lower power usage, the timing circuit 670 may receive a clock signal from another circuit block, such as one that times self-refresh operations. In some cases, an output of the timing circuit 670 presents a high value responsive to an expiration or lapsing of the delay interval, regardless of if there is a default delay interval $t_{Delay}$ or a selectable delay interval $t_{Delay}'$. A delay input 770 of the timing circuit 670 may be used to select between the default delay interval $t_{Delay}$ and at least one selectable delay interval $t_{Delay}'$. The delay input 770 can receive a delay signal 771 (of FIGS. 7-1 to 7-5), which can be implemented as an "internal" signal that is provided by the fuse circuit 336, such as from tmfzDieDis<0> 814. Regardless of whether the signal is internal or external (or a combination thereof), the delay signal 771 may establish, at least partially, a value to which the counter 874 increments or a value at which the counter 874 starts decrementing.

In the implementation of FIG. 8-1, an output of gate "1" 836 is a high value if tmfzDieDis<1> 810 is a high value and the output of the timing circuit 670 presents a high value. Similarly, an output of gate "2" 838 is a high value if tmfzDieDis<2>812 is a high value and the output of the timing circuit 670 presents a high value. With such signaling, because both the outputs of gate "1" 836 and gate "2" 838 are high values, the inputs of gate "3" 840 are at a high value. The output of gate "3" 840 can provide the die disablement signal 851, which is active high in the depicted example. The redundant signaling and logical processing of the two paths reduce a likelihood that the die may be inadvertently disabled by the die disablement logic 132. Before the output of the timing circuit 670 reaches a high value or if the fuse signal tmfzDieDis<1> 810 or tmfzDieDis<2> 812 presents a low value, the output of gate "3" 840 is an inactive low value. Thus, in such circumstances, the die disablement signal 851 presents a low value, which does not disable the die in these examples.

In various implementations, responsive to the die disablement logic 132 generating an active level for the die disablement signal 851, one or more circuit blocks 890-1 through 890-N may be disabled. For example, circuit block 890-1 may include a power circuit (e.g., a power management integrated circuit (PMIC)) configured to disconnect the die from power rails or otherwise decouple at least a portion of the die from power. In these or other manners, a PMIC may manage power consumption of circuitry. For example, the PMIC can power down at least a portion of an IC chip, such as by powering down individual cores or blocks. Disconnecting the die from power can reduce power consumption by the die and may suppress operation of the die. Circuit block 890-2 may include input-output circuits that decouple the input pins and output pins from on-chip input lines and output lines, respectively, to prevent the die from generating output signals responsive to input signals or based on other signals or processing.

Because the die may have been determined to be unusable, suppressing outputs that may not be valid can prevent a defective die from interfering with outputs of another die or providing erroneous signaling. It will be appreciated that circuitry to disable the input circuits and the output circuits may be implemented in separate circuit blocks. Additional circuit blocks (e.g., a memory array, a cache, a command decoder, control circuitry, a processor, or a cryptographic engine) also may respond based on the die disablement signal 851 to prevent consumption of power, generation of spurious signals, or other functions of the die. Two further examples are explicitly depicted: a command decoder circuit block 890-3 and a memory array circuit block 890-N. In some implementations, responses of the circuit blocks 890-1 through 890-N to the die disablement signal 851 may reduce power consumption of the die in a manner corresponding to an IDD2PS mode (of at least one JEDEC specification) or a least-power leakage mode for the die.

FIG. 8-2 illustrates example implementations for operations of the die disablement logic 132 being responsive to the override signal 551. As shown, the die disablement logic 132 is associated with at least one latch 860. Although depicted separately, the die disablement logic 132 can instead include the latch 860. In example operations, the latch 860 passes the two bits from the tmfzDieDis<2:1> to the AND gates 836 and 838. However, if the override signal 551 is asserted or becomes active (e.g., goes low), then the latch 860 terminates the pass-through and instead forwards low values on one or both the lines leading to the AND gates 836 and 838. If the timing circuit 670 has determined that the delay interval has lapsed or expired prior to the override signal 551 becoming asserted or active, then the gate "3" 840 has already generated an active die disablement signal 851, which may be latched or buffered to be unchanging without a power cycling or reset signal. On the other hand, if the override signal 551 becomes asserted or active prior to the lapsing of the delay interval, then the die disablement logic 132 is prevented from disabling the die because the circuitry of the latch 860 is forwarding low values when the output of the timing circuit 670 first goes high.

The latch 860 and/or the inclusion of the override signal 551 may be implemented differently than is depicted in FIG. 8-2 and described above. For example, the latch 860 may be positioned "after" (from a signal flow perspective) the gate "3" 840. In some of such cases, the latch 860 may be coupled between an output of the gate "3" 840 and the circuit blocks 890-1 to 890-N (of FIG. 8-1). As another example, the latch 860 may be coupled between an output of the timing circuit 670 and inputs of the gates 836 and 838. Thus, an asserted or active override signal 551 can trigger a blocking of the output from the timing circuit 670 with such a coupling of a latch. Further, the override signal feature for external disablement (e.g., via an override signal input 550) of the die disablement logic 132 may be otherwise implemented.

Figures 1, 9:
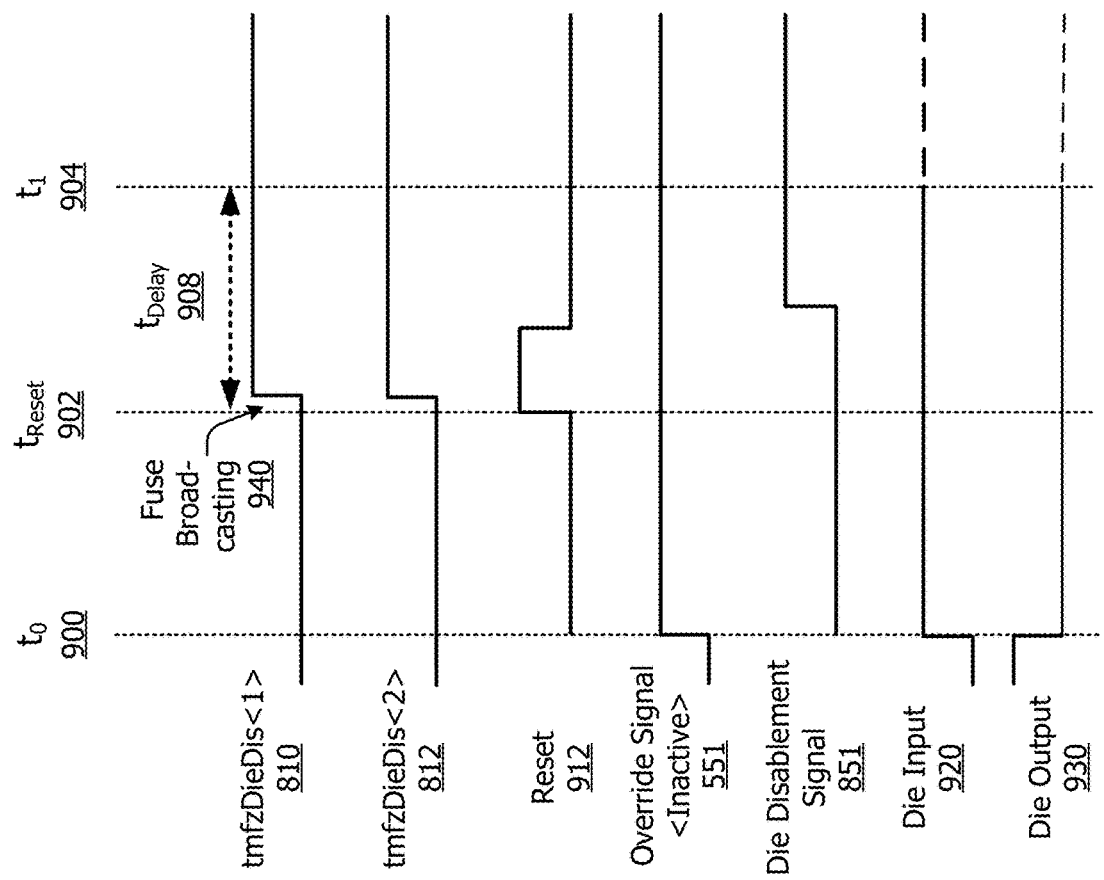
Figures 2, 9:
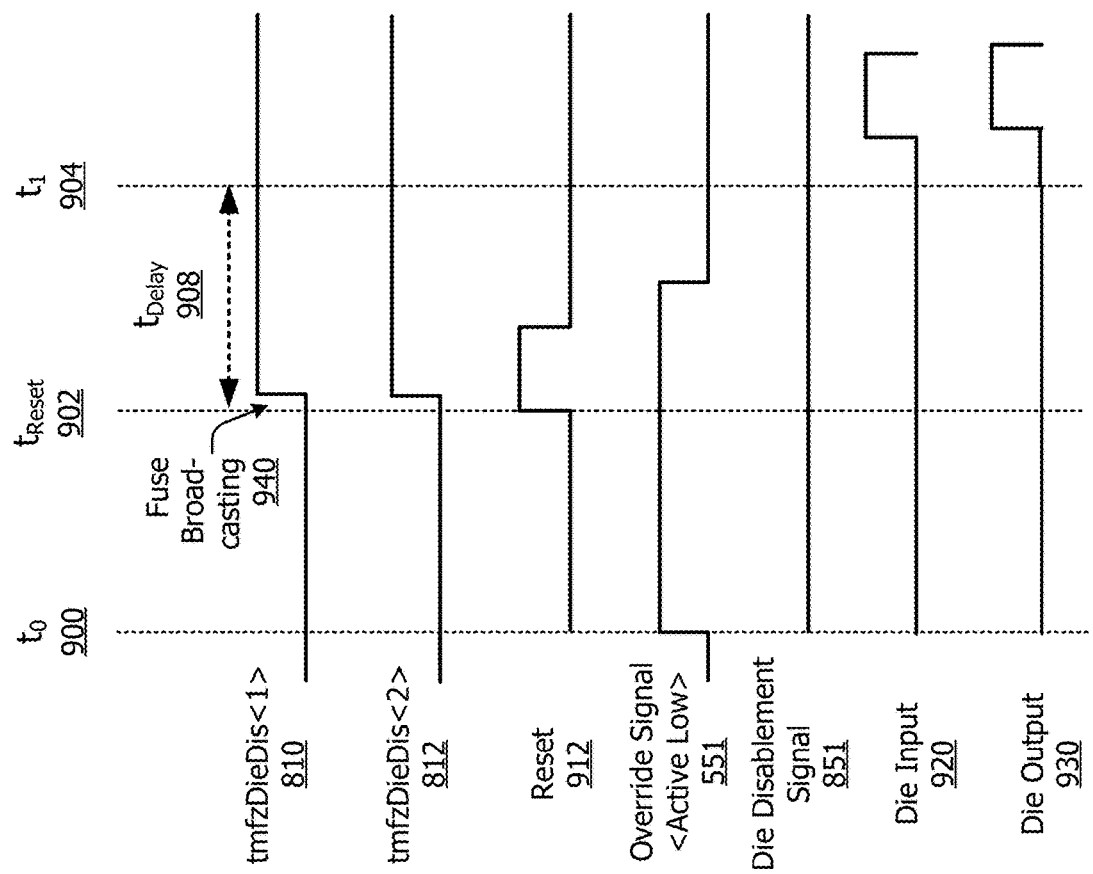

Referring to FIGS. 9-1 and 9-2, signal timing diagrams further illustrate example operations of die disablement, such as can be supported by the die disablement logic 832 of FIG. 8-1 or 8-2. Both FIGS. 9-1 and 9-2 depict a sequence spanning a time from a starting point $t_0$ 900; through a reset time $t_{Reset}$ 902, when a power-up or other reset signal is received; and through a first time $t_1$ 904, which is after the end of a delay interval $t_{Delay}$ 908. The delay interval $t_{Delay}$ 908, as previously described, may be a default interval or may include a selectable interval that can be shorter or longer than the default interval. In both FIGS. 9-1 and 9-2, at least one value maintained by the fuse circuit 336 is a high value to indicate that the associated die has been indicated to be unusable. Thus, as previously described, whether a value of the die disablement signal 851 is to disable one or more circuit blocks depends at least partially on the override signal 551 and the timing at which the signal is asserted if it becomes active.

Referring particularly to FIG. 9-1, after a reset signal 912 is received at $t_{Reset}$ 902, the delay interval $t_{Delay}$ 908 commences. As described with reference to FIGS. 8-1 and 8-2, two signal bits, tmfzDieDis<1> 810 and tmfzDieDis<2> 812 can realize the at least one value for indicating if the die is usable. As described with reference to FIG. 8-1, both tmfzDieDis<1> 810 and tmfzDieDis<2> 812 present a high value after fuse broadcasting 940 to provide the die disablement logic with a measure of redundancy to avoid inadvertent die disablement. During the delay interval $t_{Delay}$ 908, a tester or engineer may choose to enable or disable the die disablement feature by providing an override signal 551.

In the example of FIG. 9-1, high values are present for tmfzDieDis<1> 810 and tmfzDieDis<2> 812, including after the reset time $t_{Reset}$ 902 and during the delay interval $t_{Delay}$ 908 to activate the die disablement logic. Further, the override signal 551 is inactive high. As a result, the die disablement signal 851 goes to a high value and is presented to various circuit blocks of the die, such as circuit blocks 890-1 to 890-N. Thus, after the end of the delay interval $t_{Delay}$ 908 at the first time $t_1$ 904, the die is unresponsive to die input 920 and does not generate die output 930. Also, until another reset signal is received or power cycling occurs, the die disablement signal 851 can remain high such that the affected circuit blocks of the die remain disabled—e.g., can remain high using the die disablement logic 132 or a buffer at the output thereof.

Referring particularly to FIG. 9-2, after a reset signal 912 is received at the reset time $t_{Reset}$ 902, the delay interval $t_{Delay}$ 908 commences. Although tmfzDieDis<1> 810 and tmfzDieDis<2> 812 have high values after fuse broadcasting 940, the override signal 551 goes active low during the delay interval $t_{Delay}$ 908. As a result, the die disablement logic 132 is prevented from disabling the die based on the low value presented for the override signal 551 (e.g., as presented by a tester or engineer). Thus, the die disablement signal 851 is a low value, and circuit blocks of the die are not disabled. Accordingly, after the end of the delay interval $t_{Delay}$ 908 at the first time $t_1$ 904, the die is responsive to die input 920 and generates die output 930. Despite the fuse settings, the active, low value presented for the override signal 551 prevents the die disablement logic from disabling the die, and the tester or engineer can debug or otherwise interact with the die. If, in contrast to the depicted signal timing diagrams, at least one fuse bit tmfzDieDis<2:1> stored a low value, the die disablement logic would not disable the die (e.g., the logic may be inactive) based on the fuse value(s), so the die disablement logic would not disable the die regardless of the value of the override signal 551.

Example Methods

Figure 10:
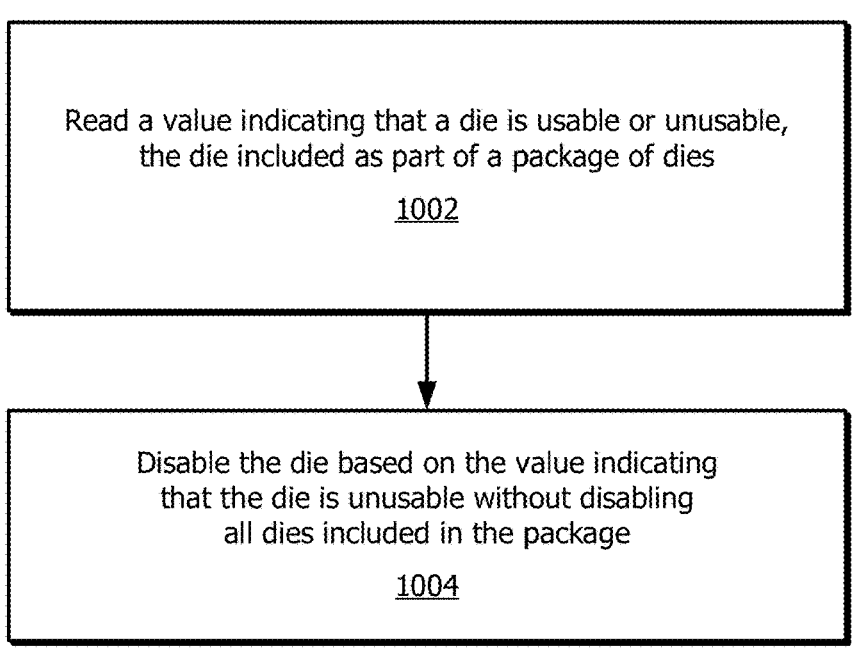
FIGS. 10 and 11 illustrate example methods of performing a die disablement operation.
Figure 11:
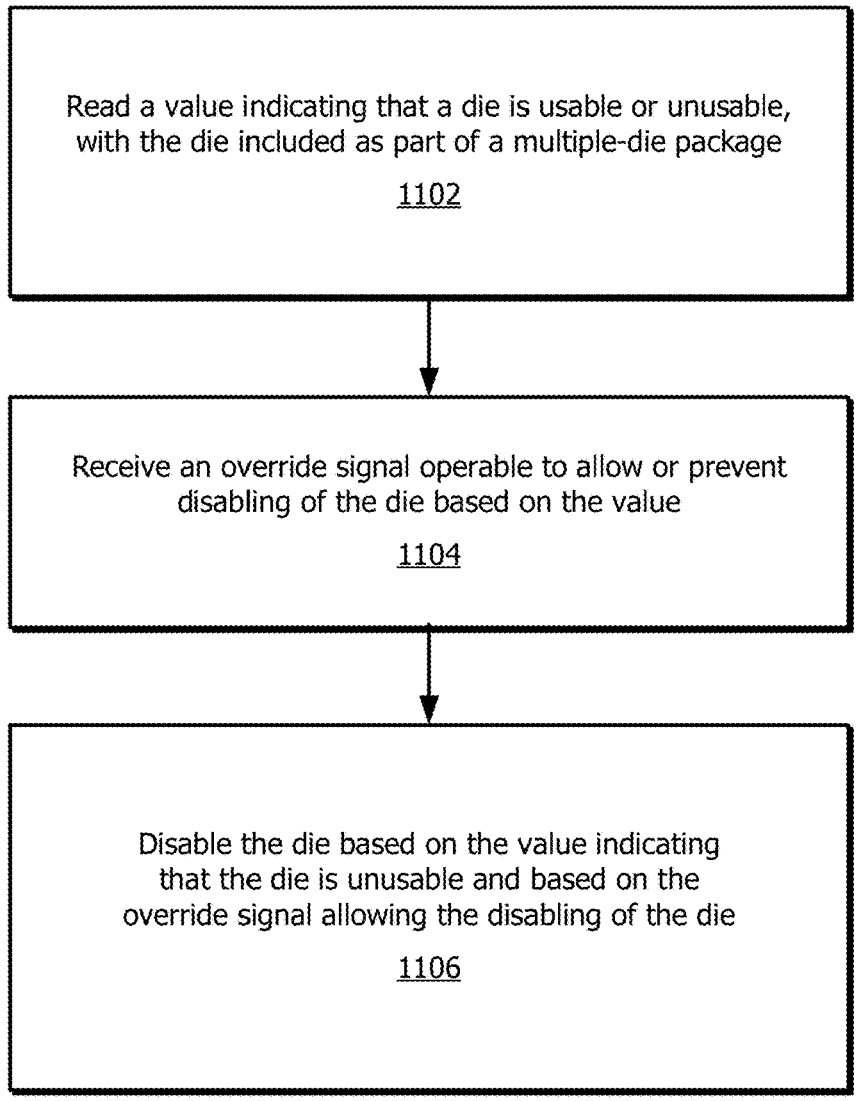

This section describes example methods with reference to the flow diagrams of FIGS. 10 and 11 for implementing die disablement for one or more dies of a multiple-die package. These descriptions may also refer to components, entities, and other aspects depicted in FIGS. 1 through 9-2, of which any such reference is made only by way of example. In aspects, the following example methods can be at least partially performed by the die disablement logic as described above with reference to FIGS. 1 to 9-2. And as described with reference to FIGS. 1 to 9-2, the die disablement logic may be incorporated within individual dies or collectively implemented in a common circuit of a multiple-die package to selectively disable multiple die of the multiple-die package. For the sake of clarity, the flow diagrams are described with reference primarily to FIGS. 5-1 and 5-2, but it will be appreciated that the same or similar methods may be utilized with any of the apparatuses herein described.

FIG. 10 illustrates an example method 1000 for implementing die disablement. The example flow diagram 1000 begins with a memory module 502 of multiple dies (e.g., a package of dies), which may be interconnected, that are in a powered down, idle, or operating state. Here, interconnected dies may include multiple dies that are stacked or linked. Additionally or alternatively, interconnected dies may relate to a package having at least one bus that is internal to the package and/or that couples two dies together. Further, interconnected dies may relate to dies that are arranged and coupled such that one die accesses an external bus via another die.

At 1002, a value is read in which the value is indicating that a die, such as die 518-3 of the memory module 502, is usable or unusable. The memory module 502 can contain multiple dies. The value may be read upon power-up or following receipt of a reset signal. The value may be maintained in a nonvolatile circuit, such as the fuse circuit 336-3 incorporated within the die 518-3. Although as described with reference to FIG. 3-3, the value may be maintained in a fuse circuit 338 that is outside of the die 518-3.

At 1004, the die, such as the die 518-3, is disabled based on the value indicating that the die is unusable without disabling all dies included in the package. Thus, one or more of dies 518-1, 518-2, and/or through 518-N, which can be included in a multiple-die package, are not disabled in conjunction with the disabling of the die 518-3. Die disablement logic 532-3 incorporated within the die 518-3 may be used to disable the die 518-3. However, the die 518-3 may be instead disabled by common die disablement logic, such as die disablement logic 134 of FIG. 3-3 that is located outside of the die being disabled.

Disabling the die may include causing the die to be unresponsive to input signals, except for a reset signal. Disabling the die also may include disabling output signals from the die. Disabling the die may further include decoupling at least part of the die from power to reduce power consumption of the die and, thus, power consumption of the multiple-die package. This can enable the multiple-die package to consume power at a rate that is commensurate with the quantity of dies that are operational. Any one or more of these disabling aspects may be implemented as part of disabling the die.

FIG. 11 illustrates another example method 1100 for implementing die disablement. The example flow diagram 1100 begins with a package including multiple dies, such as a multiple-die memory device package realization of a memory module 502. The package may be in a powered-down, idle, or operating state. At 1102, a value is read in which the value is indicating that a die, such as die 518-3 of the multiple-die memory module 502, is usable or unusable. The value may be read responsive to power up or receipt of a reset signal. The value may be maintained in a nonvolatile circuit, such as the fuse circuit 336-3 incorporated within the die 518-3. Alternatively, as described with reference to FIG. 3-3, the value may be maintained in a fuse circuit 338 outside of the die 518-3.

At 1104, an override signal is received in which the signal allows or prevents disabling of the die based on the value that was read. For example, an override signal 551 may be received via an override input 550. The override signal 551 enables a tester or engineer to override the stored nonvolatile value(s) and/or prevent (e.g., disable) operation of the die disablement logic to facilitate testing or debugging, as previously described.

At 1106, the die, such as the die 518-3, is disabled based on the value indicating that the die is unusable and based on the override signal allowing the disabling of the die. In some cases, the disabling of the operation of the die disablement logic can occur if the override signal is received during a delay interval following receipt of a reset signal or power up by the die, as described with reference to FIGS. 9-1 and 9-2. Thus, for example, the die 518-3 may be disabled if the value(s) stored in the fuse circuit 336-3 so indicate, unless the override signal 551 indicates that the die disablement logic and/or the stored value(s) are to be overridden. The efficacy of receiving the override signal 551 can be terminated responsive to lapse or expiration of the delay interval.

Die disablement logic 532-3 that is incorporated within the die 518-3 may be used to disable the die 518-3. However, the die 518-3 may be disabled instead by a common die disablement logic, such as die disablement logic 134 of FIG. 3-3 that is located outside of the die being disabled. Disabling of the die may include causing the die to be unresponsive to input signals, for instance, except for the reset signal. Disabling the die also may include disabling output signals from the die. Disabling the die may further include decoupling at least part of the die from power to reduce power consumption of the die and, thus, power consumption of the multiple-die package.

For the example flow diagrams and methods described above, the orders in which operations are shown and/or described are not intended to be construed as a limitation. Any number or combination of the described operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components that are described above, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although this document describes implementations of die disablement in language specific to certain features or methods, the subject of the appended claims is not limited to the described features or methods. Instead, this document discloses the described features and methods as example implementations of die disablement.

What is claimed is:

1. An apparatus comprising:
a package including multiple dies, a die of the multiple dies including:
a nonvolatile circuit configured to maintain a value for the die, the value indicative of whether the die is usable or unusable; and
logic coupled to the nonvolatile circuit and configured to disable the die based on the value,
the logic including a signal input configured to receive a signal operable to selectively allow the logic to disable the die based on the value or prevent the logic from disabling the die, and
the logic further configured to cease responding to the signal to prevent the logic from disabling the die after expiration of a delay interval that follows receipt by the die of a reset signal.

2. The apparatus of claim 1, wherein the nonvolatile circuit includes a fuse circuit.

3. The apparatus of claim 1, wherein the nonvolatile circuit includes a flash memory cell.

4. The apparatus of claim 1, wherein the logic includes another signal input configured to receive another signal from the nonvolatile circuit, the other signal indicative of the value.

5. The apparatus of claim 4, wherein the other signal includes at least two bits.

6. The apparatus of claim 5, wherein the logic includes a separate data path for each bit of the at least two bits.

7. The apparatus of claim 1, wherein the delay interval includes a default interval.

8. The apparatus of claim 1, wherein the delay interval includes a selectable interval.

9. The apparatus of claim 8, wherein the selectable interval is selectable responsive to another signal that is operable to select a time period of two or more time periods.

10. The apparatus of claim 1, wherein the logic is coupled to power management logic configured to power down at least a portion of the die responsive to the die being disabled.

11. The apparatus of claim 1, wherein the die is configured to respond to the reset signal responsive to the die being disabled.

12. The apparatus of claim 11, wherein the die is configured to prevent a response to all signal inputs other than the reset signal while the die is disabled.

13. The apparatus of claim 1, wherein the apparatus comprises a Compute Express Link™ (CXL) memory device.

14. The apparatus of claim 13, wherein the CXL memory device comprises a Type 3 CXL memory device.

15. An apparatus comprising:
a package including:
multiple dies;
a nonvolatile circuit associated with each respective die of the multiple dies and configured to maintain a respective value for each respective die of the multiple dies, each respective value indicative of whether each respective die is usable or unusable; and
logic coupled to the nonvolatile circuit and configured to disable each die of the multiple dies based on the respective value of each respective die of the multiple dies,
the logic including a signal input configured to receive a signal operable to selectively prevent the logic from disabling each respective die or allow the logic to disable each respective die based on the respective value maintained for the respective die.

16. The apparatus of claim 15, wherein the nonvolatile circuit includes a common nonvolatile circuit configured to maintain the respective value for each respective die of the multiple dies included in the package.

17. The apparatus of claim 16, wherein the logic includes a common logic configured to disable each die of the multiple dies included in the package based on the respective value maintained in the common nonvolatile circuit for each respective die of the multiple dies.

18. The apparatus of claim 15, wherein at least a portion of the nonvolatile circuit associated with each respective die of the multiple dies is incorporated within the respective die of the multiple dies.

19. The apparatus of claim 18, wherein at least a portion of the logic configured to disable each die of the multiple dies is incorporated within the respective die of the multiple dies.

20. The apparatus of claim 15, wherein the logic is further configured to permit the signal to override the respective value associated with each respective die of the multiple dies during a delay interval that follows receipt of a reset signal by each respective die.

21. The apparatus of claim 20, wherein the logic is further configured to cease permitting the signal to override the respective value associated with each respective die of the multiple dies responsive to expiration of the delay interval.

22. The apparatus of claim 20, wherein the delay interval includes at least one default delay interval applicable to each respective die of the multiple dies.

23. The apparatus of claim 22, wherein the delay interval includes at least one selectable delay interval that is selectable for each respective die of the multiple dies responsive to another signal that is indicative of the at least one selectable delay interval.

24. The apparatus of claim 15, wherein each die of the multiple dies includes a dynamic random-access memory (DRAM) array.

25. The apparatus of claim 15, wherein the logic is coupled to power management logic configured to power down at least a portion of each respective die responsive to each respective die of the multiple dies being disabled.

26. The apparatus of claim 25, wherein the logic is configured to disable all inputs other than a reset input for a given die responsive to the given die of the multiple dies being disabled.

27. An apparatus comprising:
  a nonvolatile circuit configured to maintain a value indicative of a usability of a die; and
  logic coupled to the nonvolatile circuit and configured to:
    receive the value and a signal operable to override the logic;
    disable operation of the die responsive to the value indicating that the die is unusable and responsive to the signal failing to override the logic; and
    enable operation of the die responsive to the signal indicating that the logic is being overridden regardless of the value.

28. The apparatus of claim 27, wherein the nonvolatile circuit includes a fuse circuit.

29. The apparatus of claim 27, wherein the logic is further configured to respond to the signal during a delay interval that follows receipt of a reset signal by the die and to be unresponsive to the signal after lapsing of the delay interval.

30. The apparatus of claim 29, wherein the delay interval includes a default delay interval.

31. The apparatus of claim 30, wherein the delay interval includes a selectable delay interval.

32. The apparatus of claim 31, further comprising:
  a delay input configured to receive another signal operable to specify the selectable delay interval.

33. The apparatus of claim 27, wherein the logic is coupled to additional logic of the die, the additional logic configured to manage power for the die by powering down at least a portion of the die responsive to the operation of the die being disabled.

34. The apparatus of claim 27, wherein the die is configured to respond to a reset input subsequent to the operation of the die being disabled.

35. The apparatus of claim 34, wherein the die is configured to prevent a response to all signaling inputs besides the reset input subsequent to the operation of the die being disabled.

36. A method comprising:
  reading a value indicating that a die is usable or unusable, the die included as part of a multiple-die package;
  receiving an override signal operable to allow or prevent disabling of the die based on the value; and
  disabling the die based on the value indicating that the die is unusable and based on the override signal allowing the disabling of the die.

37. The method of claim 36, further comprising:
  enabling the die based on the value indicating that the die is unusable, based on the override signal preventing the disabling of the die, and responsive to the override signal being received during a delay interval that follows receipt by the die of a reset signal.

38. The method of claim 36, further comprising:
  causing the die to be unresponsive to input signals except for a reset signal based on the value indicating that the die is unusable and based on the override signal allowing the disabling of the die.

39. The method of claim 36, further comprising:
  disabling output signals from the die based on the value indicating that the die is unusable and based on the override signal allowing the disabling of the die.

40. The method of claim 36, further comprising:
  decoupling at least part of the die from power to reduce power consumption of the die based on the value indicating that the die is unusable and based on the override signal allowing the disabling of the die.

41. A method comprising:
  reading a value indicating that a die is usable or unusable, the die included as part of a package of dies; and
  disabling the die based on the value indicating that the die is unusable without disabling all dies included in the package of dies and responsive to an override signal being presented that allows disabling of the die.

42. The method of claim 41, further comprising:
  allowing the disabling of the die responsive to the override signal being presented during a delay interval that follows receipt of a reset signal by the die.

43. The method of claim 42, further comprising:
  causing the die to be unresponsive to input signals except for the reset signal based on the disabling of the die.

44. The method of claim 43, further comprising:
  disabling output signals from the die based on the disabling of the die.

45. The method of claim 41, further comprising:
  decoupling at least part of the die from power to reduce power consumption of the die based on the disabling of the die.

* * * * *